United States Patent
Yao

(10) Patent No.: US 7,479,356 B2
(45) Date of Patent: Jan. 20, 2009

(54) ALIGNING METHOD

(75) Inventor: Teruyoshi Yao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/019,190

(22) Filed: Jan. 24, 2008

(65) Prior Publication Data

US 2008/0118851 A1    May 22, 2008

Related U.S. Application Data

(63) Continuation of application No. PCT/JP2005/013632, filed on Jul. 26, 2005.

(51) Int. Cl.
*G03C 5/00* (2006.01)
*G03F 9/00* (2006.01)

(52) U.S. Cl. .............. 430/22; 430/30; 430/312

(58) Field of Classification Search .......... 430/22, 430/30, 312
See application file for complete search history.

(56) References Cited

U.S. PATENT DOCUMENTS

| | | | |
|---|---|---|---|
| 5,989,761 A | 11/1999 | Kawakubo et al. | |
| 6,238,851 B1 | 5/2001 | Nishi | |
| 6,331,369 B1 | 12/2001 | Kawakubo et al. | |
| 6,436,594 B2 * | 8/2002 | Tokunaga | 430/22 |
| 6,455,211 B1 * | 9/2002 | Yui et al. | 430/22 |
| 6,541,169 B1 * | 4/2003 | Okino et al. | 430/30 |
| 6,699,628 B2 * | 3/2004 | Shima | 430/22 |
| 6,841,321 B2 * | 1/2005 | Matsumoto et al. | 430/30 |
| 6,879,374 B2 * | 4/2005 | Van Der Werf et al. | 355/52 |
| 6,949,755 B2 * | 9/2005 | Tanaka | 250/491.1 |
| 7,054,007 B2 * | 5/2006 | Leroux et al. | 356/401 |
| 2002/0012858 A1 | 1/2002 | Kawakubo et al. | |

FOREIGN PATENT DOCUMENTS

| | | |
|---|---|---|
| JP | 8-236433 A | 9/1996 |
| JP | 8-330204 A | 12/1996 |
| JP | 9-7919 A | 1/1997 |
| JP | 9-50950 A | 2/1997 |
| JP | 10-229039 A | 8/1998 |
| JP | 11-195596 A | 7/1999 |

OTHER PUBLICATIONS

International Search Report of PCT/JP2005/013632, date of mailing Nov. 8, 2005.

* cited by examiner

*Primary Examiner*—Christopher G Young
(74) *Attorney, Agent, or Firm*—Westerman, Hattori, Daniels & Adrian, LLP.

(57) ABSTRACT

A method, wherein a plurality of first patterns are formed in an exposure region, and second patterns are formed by plural shots, with positions of alignment marks measured for said plurality of first patterns to give first positional information; relative positions of said plurality of first patterns to a first coordinate system are measured, to thereby compute first disalignments relative to the first coordinate system; second positional information is computed by subtracting the first disalignments from the first positional information; relative positions of said plural basic regions with respect to a second coordinate system are measured, to thereby compute second disalignments of the first pattern relative to the second coordinate system; third positional information is computed by subtracting the first and second disalignments from the first positional information; third disalignments of the first pattern with respect to a third coordinate system are computed; and positioning with respect to the first pattern is made when the second pattern is exposed, based on the first to third disalignments.

10 Claims, 20 Drawing Sheets

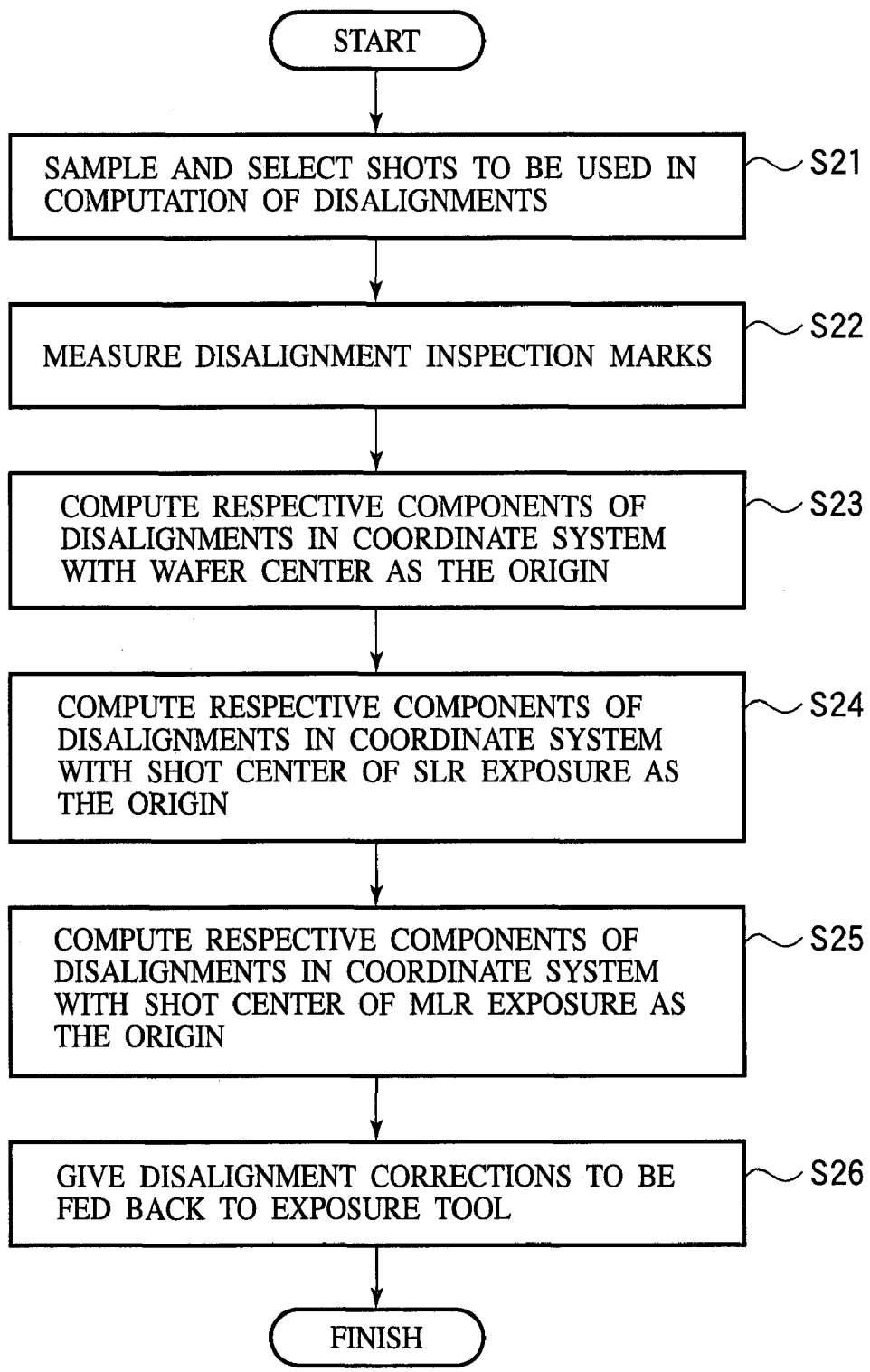

ALIGNING METHOD

CROSS REFERENCE TO RELATED APPLICATIONS

This application is a Continuation of International Application No. PCT/JP2005/013632, with an international filing date of Jul. 26, 2005, which designating the United States of America, the entire contents of which are incorporated herein by reference.

BACKGROUND OF THE INVENTION (1) Field of the Invention

The present invention relates to an aligning method for overlaying a plurality of second patterns to be formed with plural shots of exposure over first patterns formed with one shot of exposure on a substrate.

(2) Description of the Related Art

To form fine patterns of semiconductor devices, etc., in the exposure process, phase shift masks, such as halftone phase shift mask, Levenson phase shift mask, etc. are used. The exposure with phase shift masks improves the exposure latitude, focal depth, etc. and is effective to form fine patterns. However, the phase shift masks are expensive, and recently, the mask (reticle) cost increase is a large serious problem.

As a countermeasure to the mask const increase, it is proposed to use a multilayer reticle (hereinafter called "MLR") having plural layers of patterns arranged in one sheet of reticle.

FIG. 19 is a plan view of an MLR having two layers of patterns arranged in one sheet of reticle. As illustrated, in one sheet of reticle 100, a shot region 102 having a pattern of, e.g., the first interconnection layer, and a shot region 104 having a pattern of e.g., the second interconnection layer are arranged.

The MLR has the merit of reducing the mask cost. However, on the other hand, the MLR has the demerit that the exposure region per one layer of a pattern is smaller and thus the throughput of the exposure tool is decreased. Due to this, it is considered to use the MLR limitedly for layers using expensive masks, such as the phase shift mask, the mask for critical layers, etc.

In the exposure process for the masks, usually, different mask processes, in which, for example, positive resists are used, or negative resists are used, are used for respective layers using reticles. Kinds of the masks, such as binary masks or phase shift masks, are also different. Accordingly, it is difficult to arrange patterns of layers using different mask processes and different kinds of masks in one sheet of reticle.

As described above, the MLR is used to limited layers. Accordingly, in the actual manufacturing steps, a reticle other than the MLR (hereinafter called "single-layer reticle (SLR) ") must be also used for the exposure. That is, in the actual manufacturing steps, the mix-and-match exposure of the exposure using the SLR (hereinafter called "SLR exposure") and the exposure using the MLR (hereinafter called "MLR exposure") must be made.

FIG. 20A is a plan view of a shot layout of the SLR exposure, and FIG. 20B is a plan view of a shot layout of the MLR exposure to be overlaid over the shots of the SLR exposure. In FIG. 20, over one shot 106 of the SLR exposure, two shots 108 of the MLR exposure must be overlaid.

However, the mix-and-match exposure of the conventional SLR exposure and the MLR exposure has often found it difficult to overlay plural shots of the MLR exposure over one shot of the SLR exposure with high accuracy.

SUMMARY OF THE INVENTION

According to one aspect of the embodiment, there is provided an aligning method for forming, over a substrate over which a plurality of first patterns each having plural basic regions formed in an exposure region of one shot, second patterns by plural shots of exposure corresponding to the respective basic regions, comprising: measuring, for said plurality of first patterns formed over the substrate, positions of alignment marks to thereby give first positional information; giving relative positions of said plurality of first patterns with respect to a first coordinate system with the center of the substrate as the origin, based on the first positional information measured, to thereby compute first disalignments of said plurality of first patterns with respect to the first coordinate system; computing second positional information given by subtracting the first disalignments from the first positional information; giving relative positions of said plural basic regions with respect to a second coordinate system with the shot center of the first pattern as the origin, based on the second positional information, to thereby compute second disalignments of the first pattern with respect to the second coordinate system; computing third positional information given by subtracting the first disalignments and the second disalignments from the first positional information; computing third disalignments of the first pattern with respect to a third coordinate system with the shot center of the second pattern as the origin, based on the third positional information; and making positioning with respect to the first pattern when the second pattern is exposed, based on the first to the third disalignments.

According to another aspect of the embodiment, there is provided an aligning method including: measuring disalignment inspection marks for one substrate with a plurality of first patterns each having a plurality of basic regions formed in an exposure region of one shot formed on and second patterns formed on by plural shots of exposure corresponding to said respective basic region, to thereby measure disalignments of the second pattern with respect to the first pattern as first disalignment information; giving relative positions of said plural second patterns with respect to a first coordinate system with the center of the substrate as the origin to thereby compute first disalignments of said plurality of second patterns with respect to the first coordinate system; computing second disalignment information given by subtracting the first disalignments from the first disalignment information; giving, based on the second disalignment information, relative positions of said plurality of second patterns with respect to a second coordinate system with the shot center of the first pattern as the origin to thereby compute second disalignments of the second pattern with respect to the second coordinate system; computing third disalignment information given by subtracting the first disalignments and the second disalignments from the first disalignment information; computing, based on the third disalignment information, third disalignments of the second pattern with respect to a third coordinate system with the shot center of the second pattern as the origin; and making positioning with respect to the first pattern when the second pattern is exposed with respect to the first pattern formed on another substrate, based on the first to the third disalignments.

BRIEF DESCRIPTION OF DRAWINGS

FIG. 8 is a flow chart of the aligning method according to a second embodiment of the present invention.

BEST MODE FOR CARRYING OUT THE INVENTION

[Disalignments of the Mix-and-Match Exposure of the SLR Exposure and MLR Exposure]

Before the aligning method according to the present invention is explained, disalignments which could take place in the mix-and-match exposure of the SLR exposure and the MLR exposure will be explained with reference to FIGS. 1 to 4. FIGS. 1 to 4 are plan views of the disalignments which could take place in the mix-and-match exposure of the SLR exposure and the MLR exposure.

In overlaying the shots of the MLR exposure over the shots of the SLR exposure, it is considered to compute disalignment components in the two coordinate system of the XY orthogonal coordinate system with the wafer center as the origin and the XY orthogonal coordinate system with the shot center of the MLR exposure as the origin and, based on a result of this computation, make the alignment.

However, the SLR exposure and the MLR exposure have shot centers different from each other. Accordingly, when disalignment components are computed in the two coordinate systems of the XY orthogonal coordinate system with the wafer center as the origin and the XY orthogonal coordinate system with the shot center of the MLR exposure as the origin, disalignment components which cannot be corrected take place. This makes it difficult to overlay the shots of the MLR exposure over the shots of the SLR exposure with high accuracy, and disalignments take place.

Figure 1A:
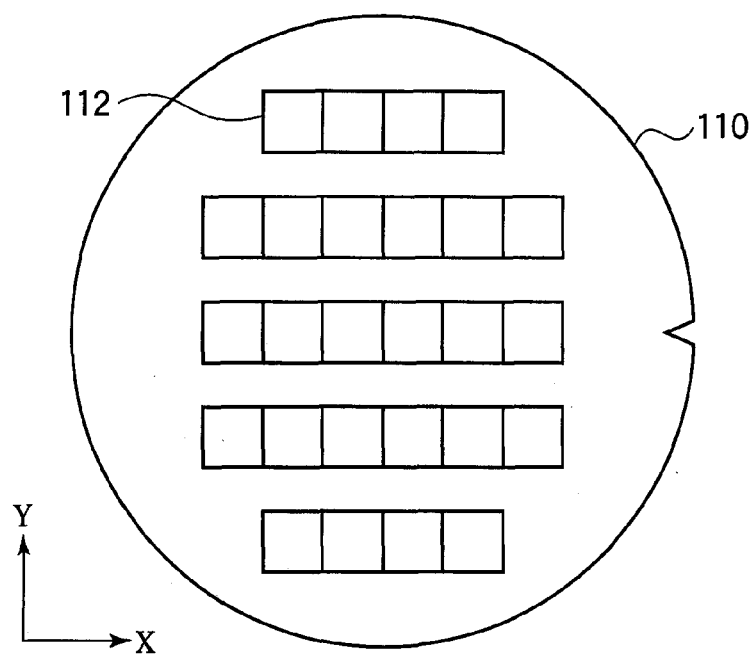
FIG. 1 is plan views illustrating disalignments which could take place in the mix-and-match exposure of the SLR exposure and the MLR exposure (Part 1).
Figure 1B:
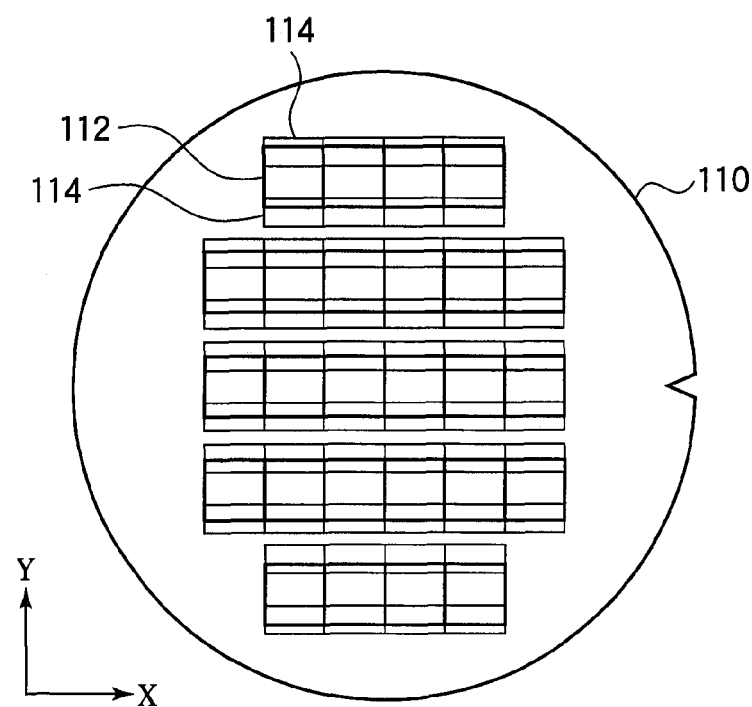

First, disalignments in the case when the wafer scaling takes place in the Y direction in the SLR exposure will be explained with reference to FIG. 1. FIG. 1A is a plan view of the shots of the SLR exposure in the case when the wafer scaling takes place in the Y direction, and FIG. 1B is a plan view of the shots of the MLR exposure overlaid over the shots of the SLR exposure illustrated in FIG. 1A.

As illustrated in FIG. 1A, the shots 112 of the SLR exposure transferred to the wafer 110 are spaced from the design shot layout in the Y direction. In such case, disalignment components in the two coordinate systems of the XY coordinate system with the wafer center as the origin and the XY coordinate system with the shot center of the MLR exposure as the origin are computed. Even when the disalignments are corrected based on the result of this computation, and the two shots of the MLR exposure are overlaid over one shot 112 of the SLR exposure, the disalignment takes place between the shot 112 of the SLR exposure and the shots 114 of the MLR exposure as illustrated in FIG. 1B.

Figure 2A:
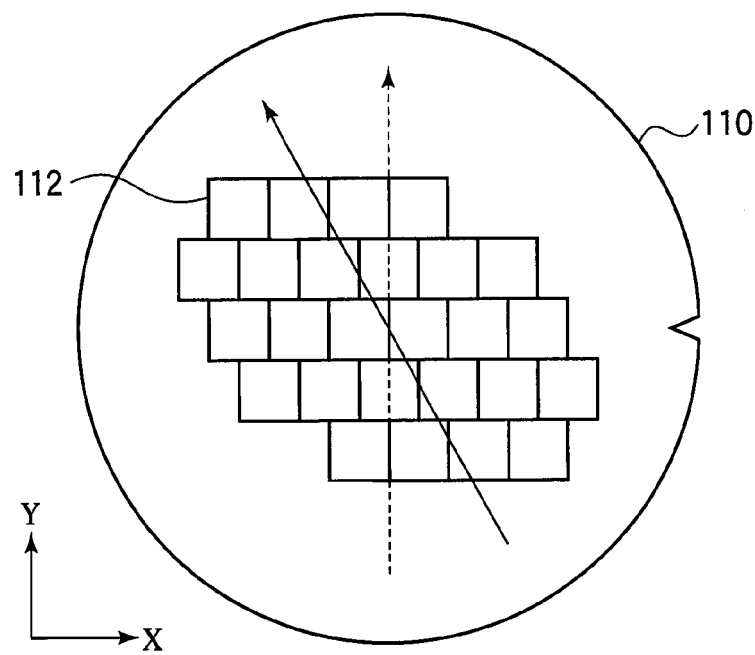
FIG. 2 is plan views illustrating disalignments which could take place in the mix-and-match exposure of the SLR exposure and the MLR exposure (Part 2).
Figure 2B:
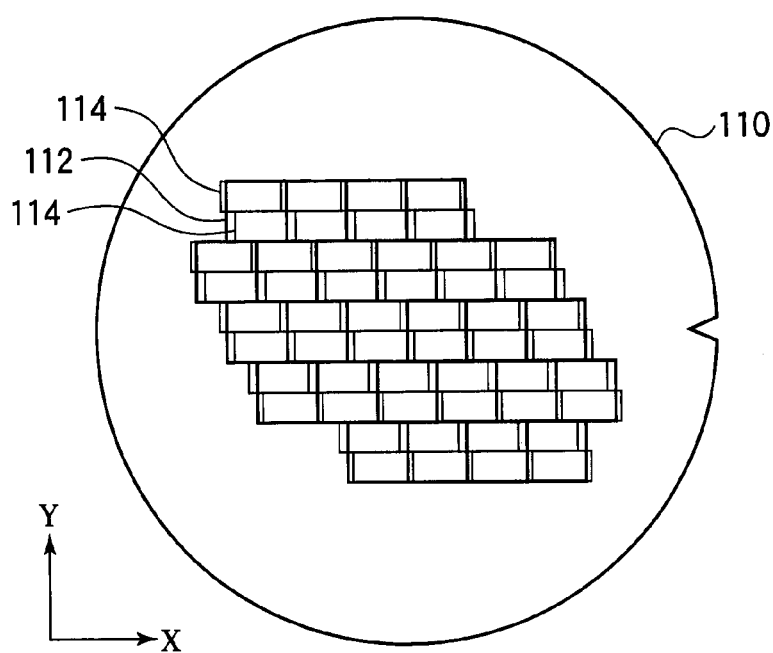

Then, disalignments in the case when the orthogonality displacement of the wafer due to the rotation of the Y axis takes place in the SLR exposure will be explained with reference to FIG. 2. FIG. 2A illustrates a plan view of the shots of the SLR exposure in the case when the orthogonality displacement due to the rotation of the Y axis takes place, and FIG. 2B is a plan view of the shots of the MLR exposure overlaid over the shots of the SLR exposure illustrated in FIG. 2A.

As illustrated in FIG. 2A, in the Y directional arrangement of the shots 12 of the SLR exposure transferred to the wafer 110, disalignments take place due to the rotation of the Y axis in comparison with the design layout. In such case, displacement components in the two coordinate systems of the XY coordinate system with the wafer center as the origin and the XY coordinate system with the shot center of the MLR exposure as the origin are computed. Even when the disalignments are corrected based on the result of this computation, and the two shots of the MLR exposure are overlaid over one shot 112 of the SLR exposure, the disalignment takes place between the shot 112 of the SLR exposure and the shots 114 of the MLR exposure as illustrated in FIG. 2B.

Figure 3A:
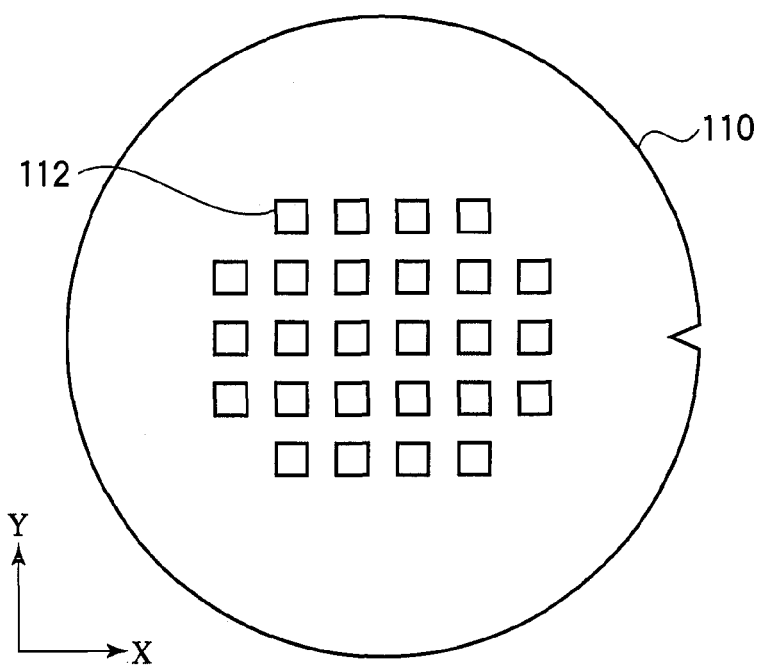
FIG. 3 is plan views illustrating disalignments which could take place in the mix-and-match exposure of the SLR exposure and the MLR exposure (Part 3).
Figure 3B:
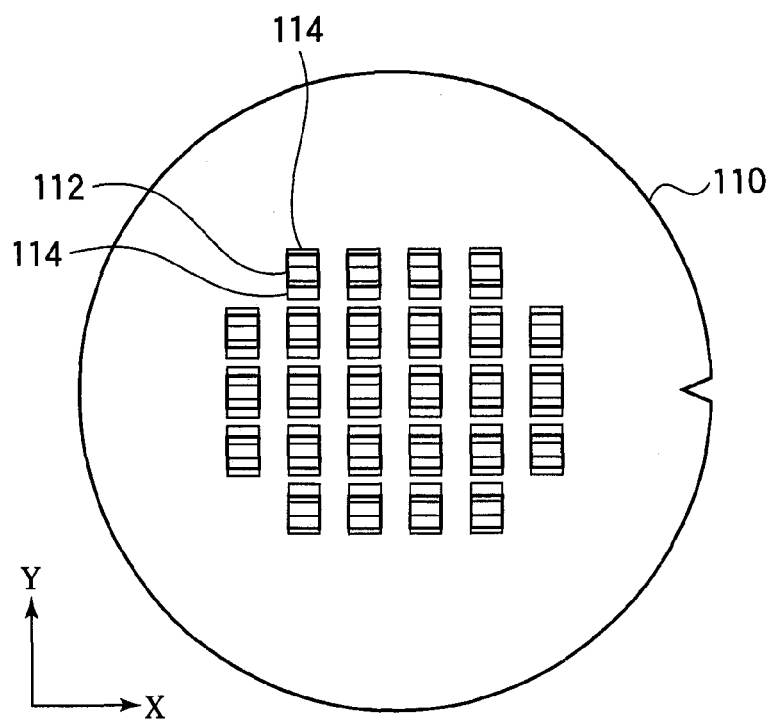

Next, disalignments in the case when the shot scaling takes place in the SLR exposure will be explained with reference to FIG. 3. FIG. 3A is a plan view of the shots of the SLR exposure in the case when the shot scaling takes place, and FIG. 3B is a plan view of the shots of the MLR exposure overlaying over the shots of the SLR exposure illustrated in FIG. 3A.

As illustrated in FIG. 3A, the shots 112 of the SLR exposure transferred to the wafer 110 have the X-directional width and the Y-directional width respectively reduced in comparison with the design shot layout. In such case, disalignment components in the two coordinate systems of the XY coordinate system with the wafer center as the origin and the XY coordinate system with the shot center of the MLR exposure as the origin are computed. Even when the disalignments are corrected based on the result of this computation, and two shots of the MLR exposure are overlaid over one shot of the SLR exposure, the disalignment take place between the shot 112 of the SLR exposure and the shots 114 of the MLR exposure as illustrated in FIG. 3B).

Figure 4A:
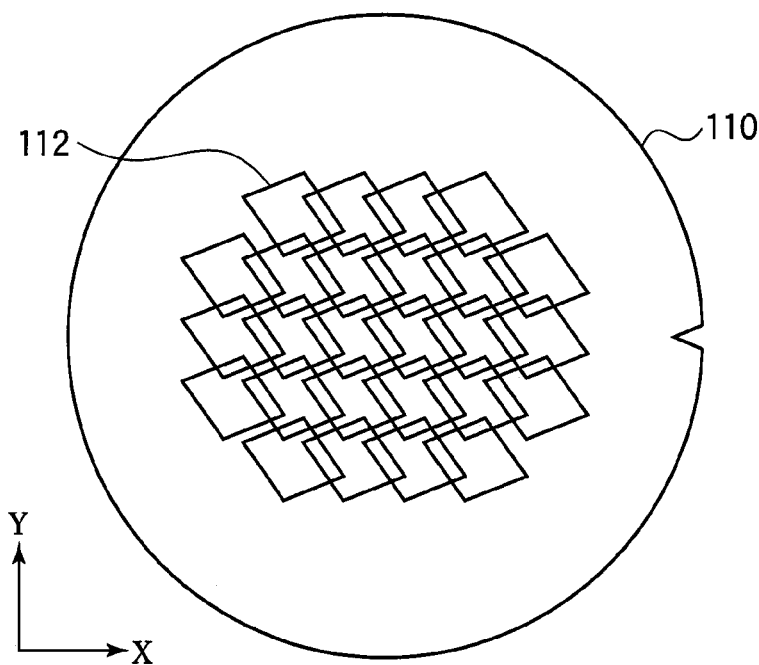
FIG. 4 is plan views illustrating disalignments which could take place in the mix-and-match exposure of the SLR exposure and the MLR exposure (Part 4).

Next, disalignments in the case when the wafer rotation takes place in the SLR exposure will be explained with reference to FIG. 4. FIG. 4A is a plan view of the shots of the SLR exposure in the case when the wafer rotation takes place, and FIG. 3B is a plan view of the shots of the MLR exposure overlaying over the shots of the SLR exposure illustrated in FIG. 3A.

Figure 4B:
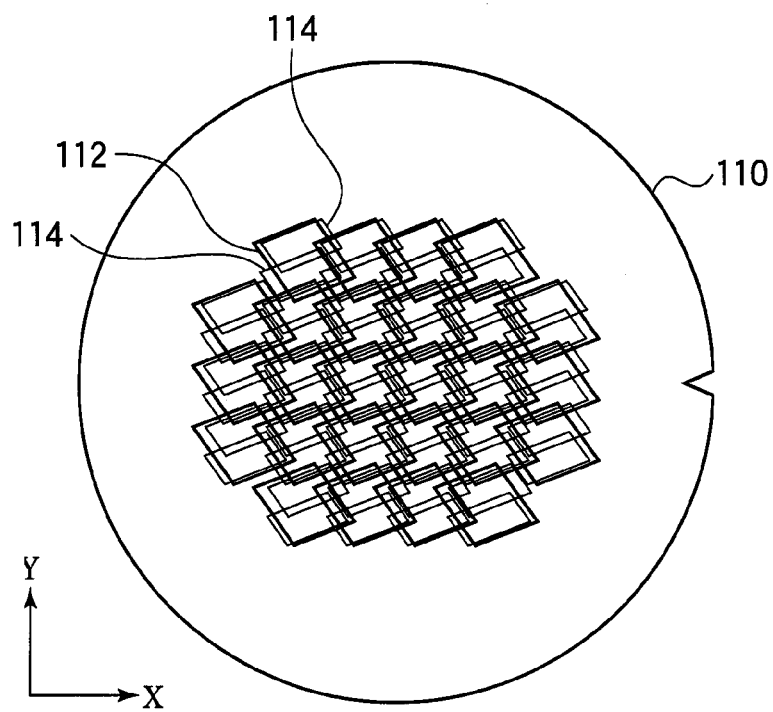

As illustrated in FIG. 4A, the shots 112 of the SLR exposure transferred to the wafer 110 are rotated in comparison with the design shot layout. In such case, disalignment components in the two coordinate systems of the XY coordinate system with the wafer center as the origin and the XY coordinate system with the shot center of the MLR exposure as the origin are computed. Even when the disalignments are corrected based on the result of this computation, and two shots of the MLR exposure are overlaid over one shot 112 of the SLR exposure, the disalignment take place between the shot 112 of the SLR exposure and the shots 114 of the MLR exposure as illustrated in FIG. 4B.

As described above, the SLR exposure and the MLR exposure have shot centers different from each other. Accordingly, disalignment components take place which cannot be corrected only by computing disalignment components between the XY coordinate system with the wafer center as the origin and XY coordinate system with the shot center of the MLR exposure as the origin. Resultantly, it is difficult to the shots of the MLR exposure over the shots of the SLR exposure with high accuracy, and displacements take place.

The aligning method according to the present invention, in the mix-and-match exposure of the SLR exposure and the MLR exposure having shot centers different from each other, can correct disalignments taking place in both of the SLR exposure and the MLR exposure with high accuracy and overlay with high accuracy plural shots of the MLR exposure over one shot of the SLR exposure. The aligning method according to the present invention will be detailed in the following embodiments.

A FIRST EMBODIMENT

Figure 5:
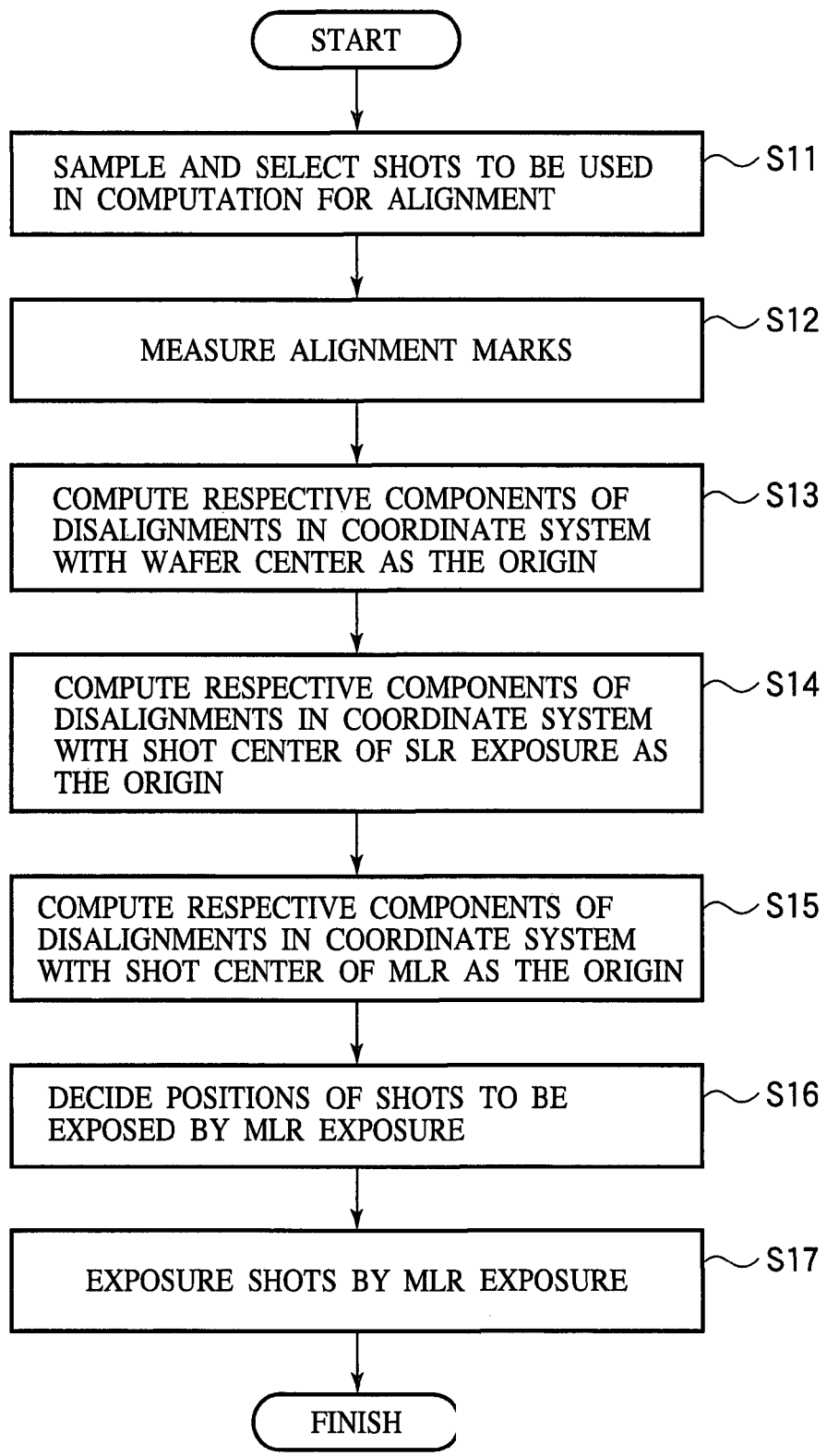
FIG. 5 is a flow chart of the aligning method according to a first embodiment of the present invention.

The aligning method according to a first embodiment of the present invention will be explained with reference to FIGS. 5 to 7. FIG. 5 is a flow chart of the aligning method according to the present embodiment. FIG. 6 is plan views illustrating the selection of sample shots in the aligning method according to the present embodiment. FIG. 7 is plan views illustrating the arrangement of alignment marks in the aligning method according to the present embodiment.

In the aligning method according to the present embodiment, the SLR exposure using a reticle with one layer of a pattern arranged is made, and then in the exposure step of making the MLR exposure using a reticle with plural layers of patterns arranged, the shots of the MLR exposure are aligned with the shots of the SLR exposure transferred to the wafer to thereby transfer the shots of the MLR exposure to the wafer.

First, the SLR exposure is made onto the wafer, and then based on the layout of the shots of the SLR exposure transferred to the wafer, shots to be used in the computation for the alignment are sampled and selected (Step S11).

Figure 6A:
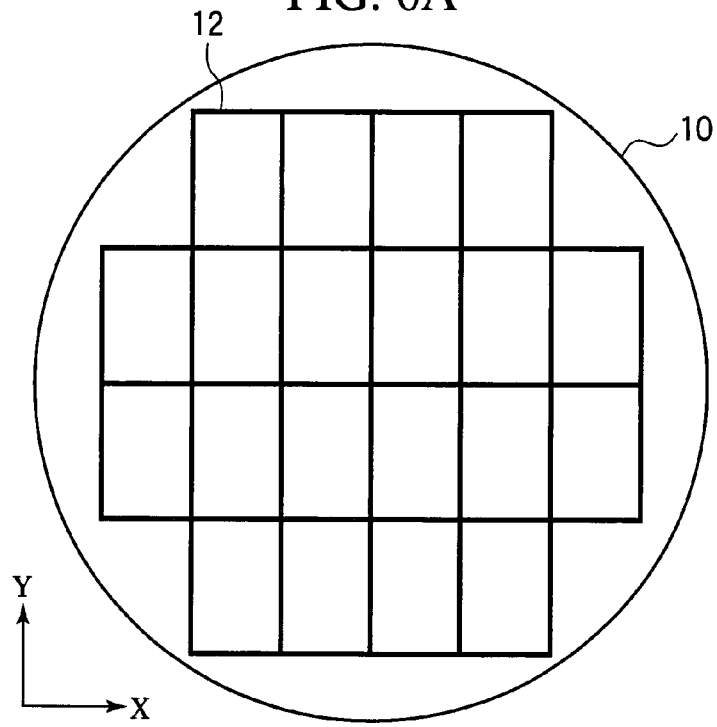
FIG. 6 is plan views illustrating the selection of sample shots in the aligning method according to the first embodiment of the present invention.
Figure 6B:
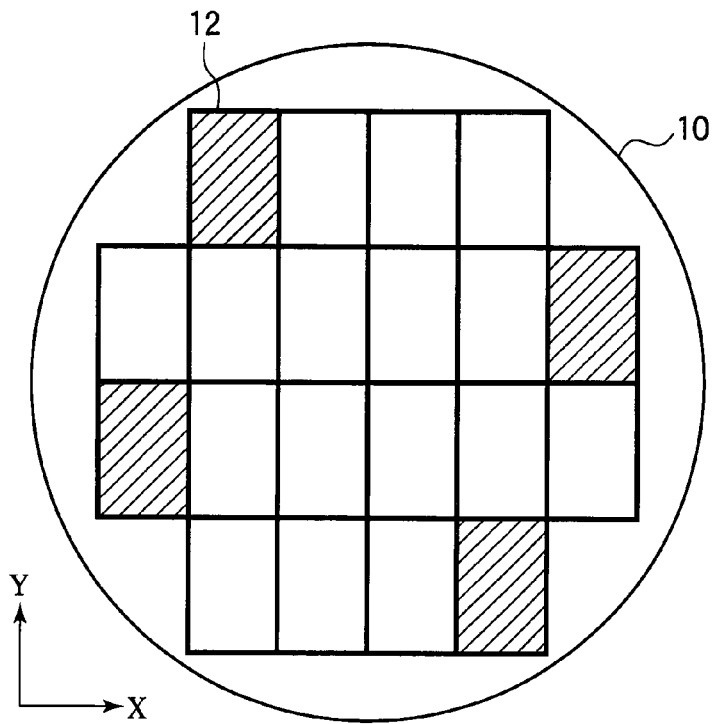

FIGS. 6A and 6B illustrate the shot layout of the SLR exposure transferred to the wafer. Out of the plural shots 12 of the SLR exposure transferred to the wafer 10 illustrated in FIG. 6A, as illustrated in FIG. 6B, four shots 12 shaded with slant lines, for example, are selected as the sample shots to be used in the computation for the alignment.

Here, alignment marks to be arranged in the sampled shots 12 are arranged at least two or more points in the region where one shot of the MLR exposure is to be exposed in the shot 12 of the SLR exposure so that disalignments can be computed in the three coordinate systems of the coordinate system with the wafer center as the origin, the coordinate system with the shot center of the SLR exposure as the origin and the coordinate system with the short center of the MLR exposure as the origin. The alignment marks have a shape, such as a cross, which permits positions in both the X direction and the Y direction to be measured.

Figure 7A:
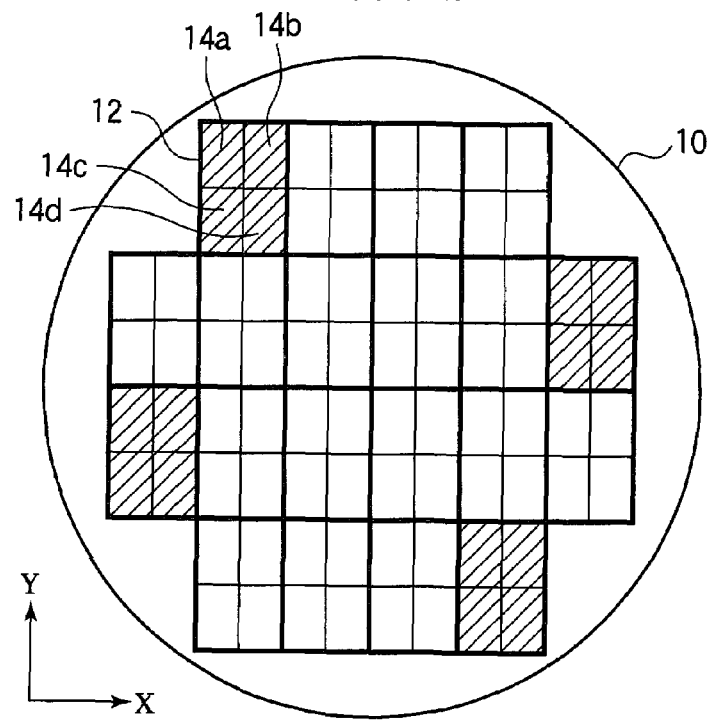
FIG. 7 is plan views illustrating the arrangement of alignment marks in the aligning method according to the first embodiment of the present invention.
Figure 7B:
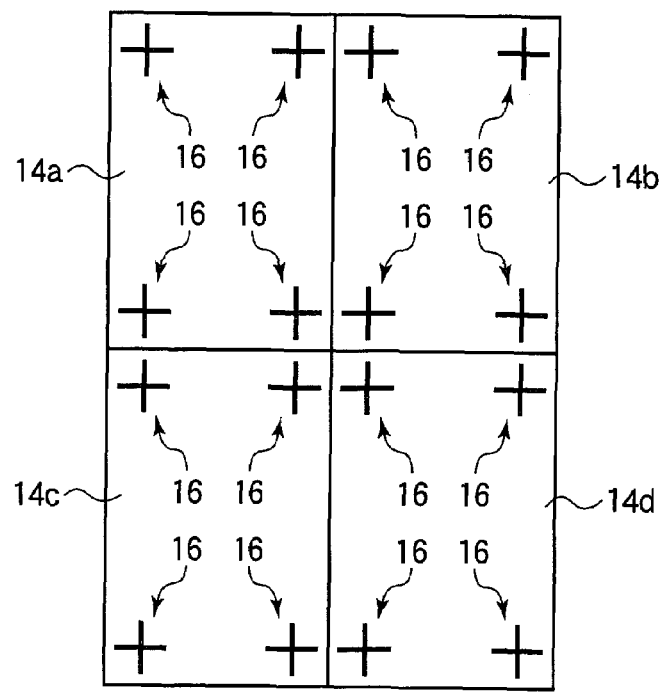

FIG. 7A is a plan view illustrating the regions of the shots of the SLR exposure illustrated in FIGS. 6A and 6B, where the shots of the MLR exposure are to be exposed. FIG. 7B is a plan view illustrating the alignment marks arranged in the regions of one shot of the SLR exposure, where the shots of the MLR exposure are to be exposed. As illustrated in FIG. 7A, four regions 14a, 14b, 14c, 14d in one rectangular shot 12 of the SLR exposure are the regions where the shots of the MLR exposure are to be exposed. The regions 14a, 14b, 14c, 14d are rectangular parts of the shot 12 of SLR exposure equally quartered by a cross line. In this case, as illustrated in FIG. 7B, four alignment marks 16 are arranged in each region 14a, 14b, 14c, 14d where the shot of the MLR exposure is to be exposed. The shape of the alignment marks 16 is, e.g., a cross. The four alignment marks 16 are located at, e.g., the four corners of each regions 14a, 14b, 14c, 14d.

Next, the alignment marks are measured with an exposure tool for the MLR exposure to obtain positional information of the alignment marks (Step S12).

Next, based on the positional information of the alignment marks 16 obtained in Step S12, relative positions of the plural shots 12 of the SLR exposure transferred to the wafer 10 with respect to the XY orthogonal coordinate system with the wafer center as the origin are computed. Specifically, the positional information of the alignment marks 16 in the respective regions 14a, 14b, 14c, 14d of each shot 12 of the SLR exposure are averaged to give central coordinates of each shot 12 of the SLR exposure. Based on the central coordinates, relative positions of the plural shots 12 of the SLR exposure transferred to the wafer 10 with respect to the XY orthogonal coordinate system with wafer center as the origin are computed.

Next, based on the computed relative positions of the plural shots 12 of the SLR exposure, respective components of disalignments of the plural shots 12 of the SLR exposure transferred to the wafer 10 with respect to the XY orthogonal coordinate system with the wafer center as the origin are computed (Step S13). Here, the components of disalignments to be computed are a shift in the X direction, a shift in the Y direction, a magnification in the X direction, a magnification in the Y direction and a rotation.

The respective components of disalignments in the XY orthogonal coordinate system with the wafer center as the origin are given by fitting computation by the least-squares method using the linear polynomials $$Dx\_w = Tx\_w + Mx\_w \times X - \text{Rot}\_w \times Y$$

and $$Dy\_w = Ty\_w + My\_w \times Y + \text{Rot}\_w \times X$$

derived from the following determinant $$\begin{pmatrix} Dx\_w \\ Dy\_w \end{pmatrix} = \begin{pmatrix} Mx\_w & -Rot\_w \\ Rot\_w & My\_w \end{pmatrix} \begin{pmatrix} X \\ Y \end{pmatrix} + \begin{pmatrix} Tx\_w \\ Ty\_w \end{pmatrix}$$

where X, Y are positions in the XY orthogonal coordinate system with the wafer center as the origin; Dx_w is a disalignment in the X direction; Dy_w is a disalignment in the Y direction; Tx_w is a shift in the X direction; Ty_w is a shift in the Y direction; Mx_w is a magnification in the X direction; My_w is a magnification in the Y direction; and Rot_w is a rotation.

Then, the respective components of the disalignments in the XY orthogonal coordinate system with the wafer center as the origin given in Step S13 are subtracted from the positional information of the alignment marks 16 obtained in Step S12. Subsequently, based on the positional information of the alignment marks 16 from which the respective components of the disalignments in the XY orthogonal coordinate system with the wafer center as the origin have been subtracted, relative positions of the regions 14a, 14b, 14c, 14d in the shot 12 of the SLR exposure, where the shots of the MLR exposure are exposed, with respect to the XY orthogonal coordinate system with the shot center of the SLR exposure are computed. Specifically, positional information of the alignment marks 16 in the respective regions 14a, 14b, 14c, 14d in the shot 12 of the SLR exposure having the disalignments subtracted are averaged to give center coordinates of the respective regions 14a, 14b, 14c, 14d. Then, based on the central coordinates, relative positions of the regions 14a, 14b, 14c, 14d with respect to the XY orthogonal coordinate system with the shot center of the SLR exposure as the origin are computed.

Next, based on the computed relative positions of the regions 14a, 14b, 14c, 14d, the respective components of disalignments of the shot 12 of the SLR exposure transferred on the wafer 10 with respect to the XY orthogonal coordinate system with the shot center of the SLR exposure as the origin are computed (Step S14). Here, the components of the disalignments to be computed are a shift in the X direction, a shift in the Y direction, a magnification in the X direction, a magnification in the Y direction and a rotation.

The respective components of disalignments in the XY orthogonal coordinate system with the shot center of the SLR exposure as the origin are given by fitting computation by the least-squares method using the linear polynomials $$Dx\_s = Tx\_s + Mx\_s \times X' - Rot\_s \times Y'$$

and $$Dy\_s = Ty\_s + My\_s \times Y' + Rot\_s \times X'$$

derived from the following determinant $$\begin{pmatrix} Dx\_s \\ Dy\_s \end{pmatrix} = \begin{pmatrix} Mx\_s & -Rot\_s \\ Rot\_s & My\_s \end{pmatrix} \begin{pmatrix} X' \\ Y' \end{pmatrix} + \begin{pmatrix} Tx\_s \\ Ty\_s \end{pmatrix}$$

where X', Y' are positions in the XY orthogonal coordinate system with the shot center of the SLR exposure as the origin; Dx_s is a disalignment in the X direction; Dy_s is a disalignment in the Y direction; Tx_s is a shift in the X direction; Ty_s is a shift in the Y direction; Mx_s is a magnification in the X direction; My_s is a magnification in the Y direction; and Rot_s is a rotation.

Then, the respective components of the disalignments in the XY orthogonal coordinate system with the wafer center as the origin given in Step S13, and the respective components of the disalignments in the XY orthogonal coordinate system with the shot center of the SLR exposure as the origin given in Step S14 are respectively subtracted from the positional information of the alignment marks 16 obtained in Step S12. Subsequently, based on the positional information of the alignment marks 16 from which the respective components of the disalignments in the XY orthogonal coordinate system with the wafer center as the origin and the respective components of the disalignments in the XY orthogonal coordinate system with the shot center of the SLR exposure as the origin have been subtracted, the respective components of disalignments of the shot 12 of the SLR exposure transferred to the wafer 10 with respect to the XY orthogonal coordinate system with the shot center of the MLR exposure as the origin are computed (Step S15). Here, the components of the disalignments to be computed are a shift in the X direction, a shift in the Y direction, a magnification in the X direction, a magnification in the Y direction and a rotation.

The respective components of disalignments in the XY orthogonal coordinate system with the shot center of the MLR exposure as the origin are given by fitting computation by the least-squares method using the linear polynomials $$Dx\_ss = Tx\_ss + Mx\_ss \times X'' - Rot\_ss \times Y''$$

and $$Dy\_ss = Ty\_ss + My\_ss \times Y'' + Rot\_ss \times X''$$

derived from the following determinant $$\begin{pmatrix} Dx\_ss \\ Dy\_ss \end{pmatrix} = \begin{pmatrix} Mx\_ss & -Rot\_ss \\ Rot\_ss & My\_ss \end{pmatrix} \begin{pmatrix} X'' \\ Y'' \end{pmatrix} + \begin{pmatrix} Tx\_ss \\ Ty\_ss \end{pmatrix}$$

where X'', Y'' are positions in the XY orthogonal coordinate system with the shot center of the MLR exposure as the origin; Dx_ss is a disalignment in the X direction; Dy_ss is a disalignment in the Y direction; Tx_ss is a shift in the X direction; Ty_ss is a shift in the Y direction; Mx_ss is a magnification in the X direction; My_ss is a magnification in the Y direction; and Rot_ss is a rotation.

Then, based on the respective components of the disalignments in the XY orthogonal coordinate system with the wafer center as the origin given in Step S13, the respective components of the disalignments in the XY orthogonal coordinate system with the shot center of the SLR exposure as the origin and the respective components of the disalignments in the XY orthogonal coordinate system with the shot center of the MLR exposure as the origin, the disalignments are corrected to align the shots of the MLR exposure to be exposed with one shot 12 of the SLR exposure. Thus, the positions of the shots of the MLR to be exposed are decided (Step S16).

Then, based on the shot positions decided in Step S16, the MLR exposure is made with an exposure tool to transfer the shots of the MLR exposure to the wafer 10 (Step S17).

Thus, after the correction of the disalignments have been made, plural second patterns formed by the exposure of the plural shots of the MLR exposure are overlaid and exposed with respect to the respective plural first patterns formed on the wafer 10 by the exposure of one shot of the SLR exposure.

The aligning method according to the present embodiment is characterized mainly in that in the mix-and-match exposure for overlaying plural shots of the MLR exposure with respect to one shot of the SLR exposure, the correction of disalignments in the exposure step is made, based on a result of computing the respective components of the disalignments with respect to the coordinate system with the wafer center as the origin, the coordinate system with the shot center of the SLR exposure as the origin and the coordinate system with the shot center of the MLR exposure as the origin.

The correction of disalignments are not made based on a result of computing the respective components of the disalignments with respect to only the two coordinate systems of the coordinate system with the wafer center as the origin and the coordinate system with the shot center of the SLR exposure as the origin but are made based on a result of computing the respective components of the disalignments with respect to the three coordinate systems of the coordinate system with the wafer center as the origin, the coordinate system with the shot center of the SLR exposure and the coordinate system with the shot center of the MLR exposure as the origin, whereby the corrections of disalignments can be corrected with high accuracy. Thus, plural shots of the MLR exposure can be overlaid over one shot of the SLR exposure with high accuracy.

Here, in the aligning method according to the present embodiment, the alignment marks 16 for use in the computation for correcting disalignments are arranged at least two or more points in each region 14a, 14b, 14c, 14d where one shot of the MLR exposure is exposed in one shot 12 of the SLR exposure. This permits the computation for the corrections of disalignments to be made with respect to the three coordinate systems of the coordinate system with the wafer center as the origin, the coordinate system with the shot center of the SLR exposure as the origin and the coordinate system with the shot center of the MLR exposure as the origin.

A SECOND EMBODIMENT

The aligning method according to a second embodiment of the present invention will be explained with reference to FIGS. 8 to 13. FIG. 8 is a flow chart of the aligning method according to the present embodiment. FIG. 9 is plan views illustrating the selection of sample shots in the aligning method according to the present embodiment. FIG. 10 is plan views illustrating the arrangement of disalignment inspection marks in the aligning method according to the present embodiment. FIG. 11 is plan views illustrating the shot layout of the exposure for evaluating the aligning method according to the present embodiment. FIG. 12 is graphs showing the result of the evaluation of the aligning method according to the present embodiment. FIG. 13 is graphs showing the result of evaluating the aligning method according to a control. The same members of the present embodiment as those of the aligning method according to the first embodiment are represented by the same reference numbers not to repeat or to simplify their explanation.

In the aligning method according to the present embodiment, the mix-and-match exposure of the SLR exposure using a reticle with one layer of a pattern arranged and the MLR exposure using a reticle with plural layers of patterns arranged is made, and then, in the step of inspecting disalignments with a disalignment inspecting system, corrections of disalignments to be fed back to an exposure tool for correcting disalignments are given.

First, for a wafer with shots of the MLR exposure exposed after the SLR exposure, overlaid over the shots of the SLR exposure, shots to be used in the computation of disalignments are sampled and selected, based on a layout of the shots of the SLR exposure transferred to the wafer (Step S21). The plural shots of the MLR exposure are transferred, overlaid over the respective plural shots of the SLR exposure transferred to the wafer.

Figure 9A:
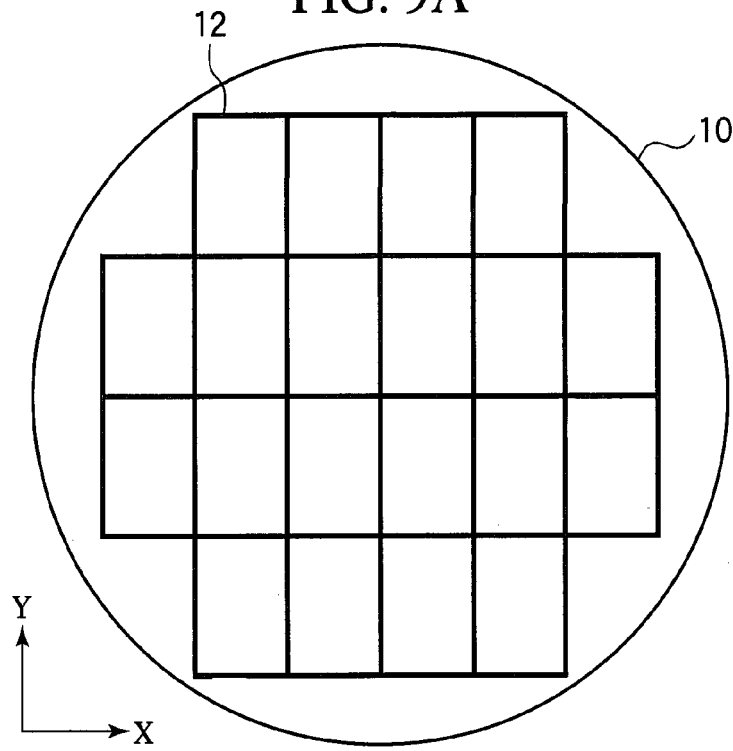
FIG. 9 is plan views illustrating the selection of sample shots in the aligning method according to the second embodiment of the present invention.
Figure 9B:
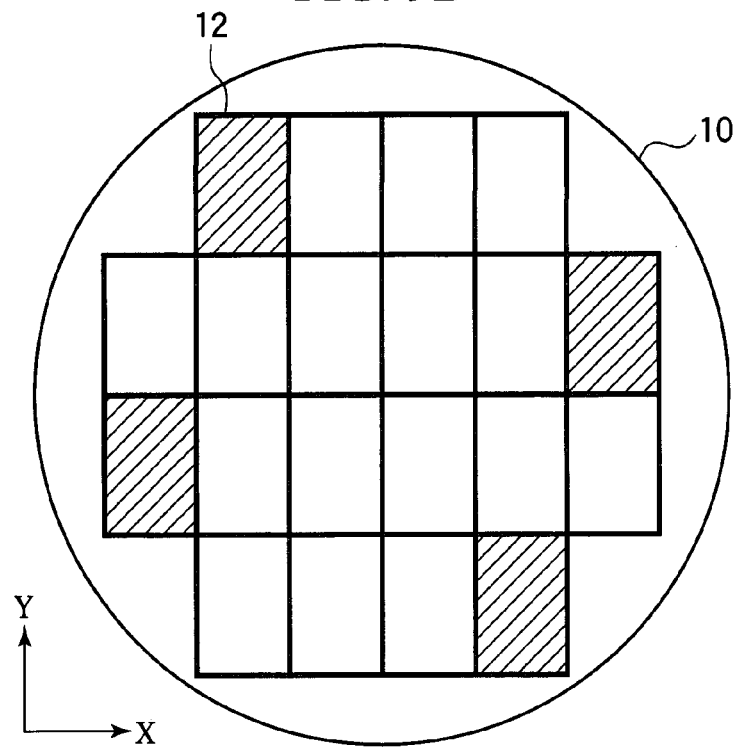

FIGS. 9A and 9B illustrate the shot layout of the SLR exposure transferred to the wafer. Out of the plural shots 12 of the SLR exposure transferred to the wafer 10 illustrated in FIG. 9A, as illustrated in FIG. 9B, four shots 12 shaded with slant lines, for example, are selected as the sample shots to be used in the computation of disalignments.

Here, the disalignment inspection marks (alignment inspection marks) to be arranged in the sampled shots 12 are arranged at least two or more points in the region where one shot of the MLR exposure is to be exposed in the shot 12 of the SLR exposure so that disalignments can be computed in the three coordinate systems of the coordinate system with the wafer center as the origin, the coordinate system with the shot center of the SLR exposure as the origin and the coordinate system with the shot center of the MLR exposure as the origin.

Figure 10A:
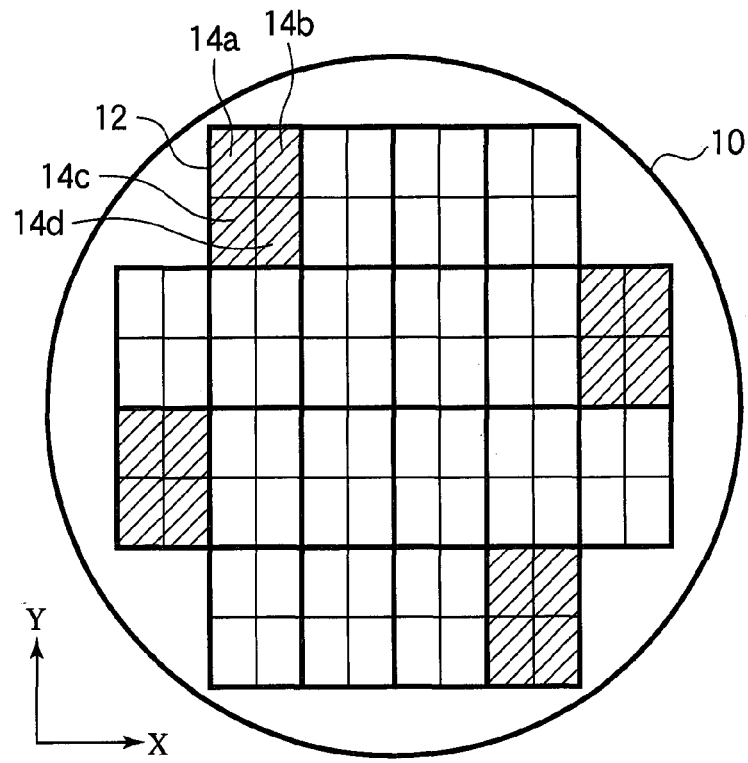
FIG. 10 is plan views illustrating the arrangement of disalignment inspection marks in the aligning method according to the second embodiment.
Figure 10B:
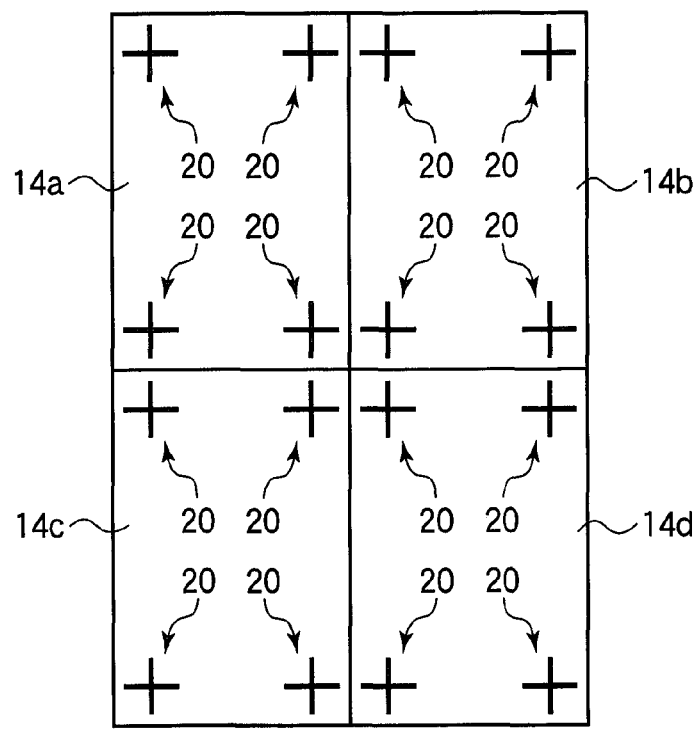
Figure 11A:
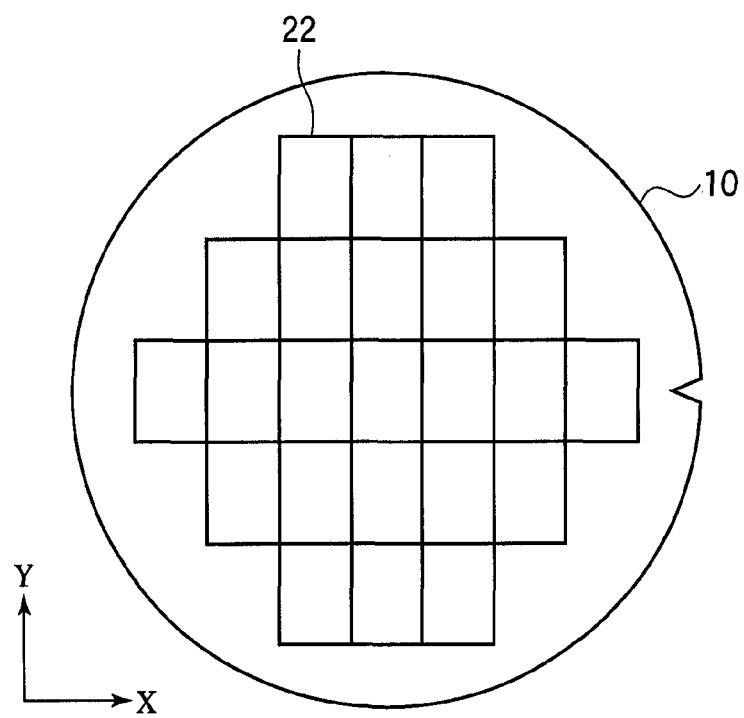
FIG. 11 is plan views of the shot layout of the exposure used in evaluation the aligning method according to the second embodiment.

FIG. 10A is a plan view illustrating the regions of the shots of the SLR exposure illustrate in FIGS. 9A and 9B, where the shots of the MLR exposure are to be exposed. FIG. 10B is a plan view illustrating the disalignment inspection marks arranged in the regions of one shot of the SLR exposure, where the shots of the MLR exposure are to be exposed. As illustrated in FIG. 10A, four regions 14a, 14b, 14c, 14d in one rectangular shot 12 of the SLR exposure are the regions where the shots of the MLR exposure are to be exposed. The regions 14a, 14b, 14c, 14d are rectangular parts of the shot 12 of SLR exposure equally quartered by a cross line. In this case, as illustrated in FIG. 10B, four disalignment inspection marks 20 are arranged in each regions 14a, 14b, 14c, 14d where the shot of the MLR exposure is to be exposed. The four disalignment inspection marks 20 are located at, e.g., the four corners of each region 14a, 14b, 14c, 14d.

The shots of the MLR exposure are exposed, overlaid over the respective regions 14a, 14b, 14c, 14d.

Next, the disalignment inspection marks 20 are measured with a disalignment inspection system to obtain information of disalignments of the shots of the MLR exposure with respect to the shot 12 of the SLR exposure (Step S22).

Next, based on the information of the disalignments of the disalignment inspection marks 20 obtained in Step S22, relative positions of the shots of the MLR exposure transferred to the wafer 10 with respect to the XY orthogonal coordinate system with the wafer center as the origin are computed. Specifically, information of disalignments of the disalignment inspection marks 20 in the plural shots of the MLR exposure overlaid over each shot 12 of the SLR exposure are averaged to give the central coordinate of the group the plural shots of the MLR exposure overlaid over the shot 12 of the SLR exposure. Based on the central coordinate, relative positions of the plural shots of the MLR exposure transferred to the wafer 10 with respect to the XY orthogonal coordinate system with the wafer center as the origin are computed.

Next, based on the computed relative positions of the shots of the MLR exposure, the respective components of the disalignments of the shots of the MLR exposure transferred to the wafer 10 with respect to the XY orthogonal coordinate system with the wafer center as the origin are computed (Step S23). Here, the components of the disalignments to be computed are a shift in the X direction, a shift in the Y direction, a magnification in the X direction, a magnification in the Y direction and a rotation.

The respective components of disalignments in the XY orthogonal coordinate system with the wafer center as the origin are given by fitting computation by the least-squares method using the linear polynomials $$Dx\_w = Tx\_w + Mx\_w \times X - Rot\_w \times Y$$

and $$Dy\_w = Ty\_w + My\_w \times Y + Rot\_w \times X$$

derived from the following determinant $$\begin{pmatrix} Dx\_w \\ Dy\_w \end{pmatrix} = \begin{pmatrix} Mx\_w & -Rot\_w \\ Rot\_w & My\_w \end{pmatrix} \begin{pmatrix} X \\ Y \end{pmatrix} + \begin{pmatrix} Tx\_w \\ Ty\_w \end{pmatrix}$$

where X, Y are positions in the XY orthogonal coordinate system with the wafer center as the origin; Dx_w is a disalignment in the X direction; Dy_w is a disalignment in the Y direction; Tx_w is a shift in the X direction; Ty_w is a shift in the X direction; Mx_w is a magnification in the X direction; My_w is a magnification in the Y direction; and Rot_w is a rotation.

Then, the respective components of the disalignments in the XY orthogonal coordinate system with the wafer center as the origin given in Step 23 are subtracted from the information of disalignments of the disalignment inspection marks 20 obtained in Step S22. Subsequently, based on information of the disalignments of the disalignment inspection marks 20 from which the respective components of the disalignments in the XY orthogonal coordinate system with the wafer center as the origin have been subtracted, relative positions of the shots of the MLR exposure transferred to the wafer 10 with respect to the XY orthogonal coordinate system with the shot center of the SLR exposure as the origin are computed. Specifically, the information of the disalignments of the disalignment inspection marks 20 in the respective shots of the MLR exposure overlaid over the shot 12 of the SLR exposure having the disalignments subtracted are averaged to give center coordinates of the respective shots of the MLR exposure overlaid over the shot 12 of the SLR exposure. Then, based on the center coordinates, relative positions of the shots of the MLR exposure transferred to the wafer 10 are computed with respect to the XY coordinate system with the shot center of the SLR exposure as the origin are computed.

Next, based on the computed relative positions of the shots of the MLR exposure, the respective components of the disalignments of the shots of the MLR exposure transferred to the wafer 10 with respect to the XY orthogonal coordinate system with the shot center of the SLR exposure as the origin are computed (Step S24). Here, the components of the disalignments to be given are a shift in the X direction, a shift in the Y direction, a magnification in the X direction, a magnification in the Y direction and a rotation.

The respective components of disalignments in the XY orthogonal coordinate system with the shot center of the SLR exposure as the origin are given by fitting computation by the least-squares method using the linear polynomials $$Dx\_s = Tx\_s + Mx\_s \times X' - Rot\_s \times Y'$$

and $$Dy\_s = Ty\_s + My\_s \times Y' + Rot\_s \times X'$$

derived from the following determinant $$\begin{pmatrix} Dx\_s \\ Dy\_s \end{pmatrix} = \begin{pmatrix} Mx\_s & -Rot\_s \\ Rot\_s & My\_s \end{pmatrix} \begin{pmatrix} X' \\ Y' \end{pmatrix} + \begin{pmatrix} Tx\_s \\ Ty\_s \end{pmatrix}$$

where X', Y' are positions in the XY orthogonal coordinate system with the shot center of the SLR exposure as the origin; Dx_s is a disalignment in the X direction; Dy_s is a disalignment in the Y direction; Tx_s is a shift in the X direction; Ty_s is a shift in the Y direction; Mx_s is a magnification in the X direction; My_s is a magnification in the Y direction; and Rot_s is a rotation.

Then, the respective components of the disalignments in the XY orthogonal coordinate system with the wafer center as the origin given in Step S23 and the respective components of the disalignments in the XY orthogonal coordinate system with the shot center of the SLR exposure as the origin given in Step S24 are respectively subtracted from the information of the disalignments of the disalignment inspection marks 20 obtained in Step S22. Subsequently, based on the information of disalignments of the disalignment inspection marks 20 from which the respective components of the disalignments in the XY orthogonal coordinate system with the wafer center as the origin and the respective components of the disalignments in the XY orthogonal coordinate with the shot center of the SLR exposure have been subtracted, the respective components of the disalignments of the shots of the MLR exposure transferred to the wafer 10 with respect to the XY orthogonal coordinate system with the shot center of the MLR exposure as the origin are computed (Step S25). Here the components of disalignments to be computed are a shift in the X direction, a shift in the Y direction, a magnification in the X direction, a magnification in the Y direction and a rotation.

The respective components of disalignments in the XY orthogonal coordinate system with the shot center of the MLR exposure as the origin are given by fitting computation by the least-squares method using the linear polynomials $$Dx\_ss = Tx\_ss + Mx\_ss \times X'' - Rot\_ss \times Y''$$

and $$Dy\_ss = Ty\_ss + My\_ss \times Y'' + Rot\_ss \times X''$$

derived from the following determinant $$\begin{pmatrix} Dx\_ss \\ Dy\_ss \end{pmatrix} = \begin{pmatrix} Mx\_ss & -Rot\_ss \\ Rot\_ss & My\_ss \end{pmatrix} \begin{pmatrix} X'' \\ Y'' \end{pmatrix} + \begin{pmatrix} Tx\_ss \\ Ty\_ss \end{pmatrix}$$

where X'', Y'' are positions in the XY orthogonal coordinate system with the shot center of the MLR exposure as the origin; Dx_ss is a disalignment in the X direction; Dy_ss is a disalignment in the Y direction; Tx_ss is a shift in the X direction; Ty_ss is a shift in the Y direction; Mx_ss is a magnification in the X direction; My_ss is a magnification in the Y direction; and Rot_ss is a rotation.

Then, based on the respective components of the disalignments in the XY orthogonal coordinate system with the wafer center as the origin given in Step S23, the respective components of the disalignments in the XY orthogonal coordinate system with the shot center of the SLR exposure as the origin given in Step S24 and the respective components of the disalignments in the XY orthogonal coordinate system with the shot center of the MLR exposure as the origin given in Step S25, disalignment corrections to be fed back to the exposure tool for correcting the disalignments are given (Step S26).

Thus, the disalignment inspection with the disalignment inspection system following the mix-and-match exposure of the SLR exposure and the MLR exposure is completed.

Then, in the exposure tool, based on the disalignment corrections given in Step S26, for the following wafer, shots of the MLR exposure are aligned with one shot of the SLR exposure transferred to the wafer 10. Subsequently, the MLR exposure is made to transfer the shots of the MLR exposure to the wafer.

Thus, for the following wafer, the disalignment correction is made using the disalignment corrections given in the disalignment inspection, and over plural first patterns formed on the wafer with one shot of exposure of the SLR exposure, plural second patterns to be formed by plural shots of the MLR exposure are overlaid and exposed.

The aligning method according to the present embodiment is characterized mainly in that in the disalignment inspection step following the mix-and-match exposure for overlaying plural shots of the MLR exposure over one shot 12 of the SLR exposure, disalignment corrections are given based on a result of computing the respective components of disalignments with respect to the three coordinate systems of the coordinate system with the wafer center as the origin, the coordinate system with the shot center of the SLR exposure as the origin and the coordinate system with the shot center of the MLR exposure as the origin.

The disalignment corrections are not given based on a result of computing the respective components of disalignments with respect to only the two coordinate systems of the coordinate system with the wafer center as the origin and coordinate system with the shot center of the MLR exposure as the origin but are given based on a result of computing the respective components of disalignments with respect to the three coordinate systems of the coordinate system with the wafer center as the origin, the coordinate system with the shot center of the SLR exposure as the origin and the coordinate system with the shot center of the MLR exposure as the origin, which allows disalignment corrections which can correct disalignments with high accuracy to be given. Thus, plural shots of the MLR exposure can be overlaid over one shot of the SLR exposure with high accuracy.

Here, in the aligning method according to the present embodiment, the alignment inspection marks 20 for use in computing disalignments for giving disalignment corrections are arranged at least two or more points in each of the regions 14a, 14b, 14c, 14d of one shot 12 of the SLR exposure, where one shot of the MLR exposure is exposed. This permits the computation for giving disalignment corrections to be made with respect to the three coordinate systems of the coordinate system with the wafer center as the origin, the coordinate system with the shot center of the SLR exposure as the origin and the coordinate system with the shot center of the MLR exposure as the origin.

(Evaluation Result)

Next, the result of experimentally evaluating the aligning method according to the present embodiment will be explained with reference to FIGS. 11 to 13.

Figure 11B:
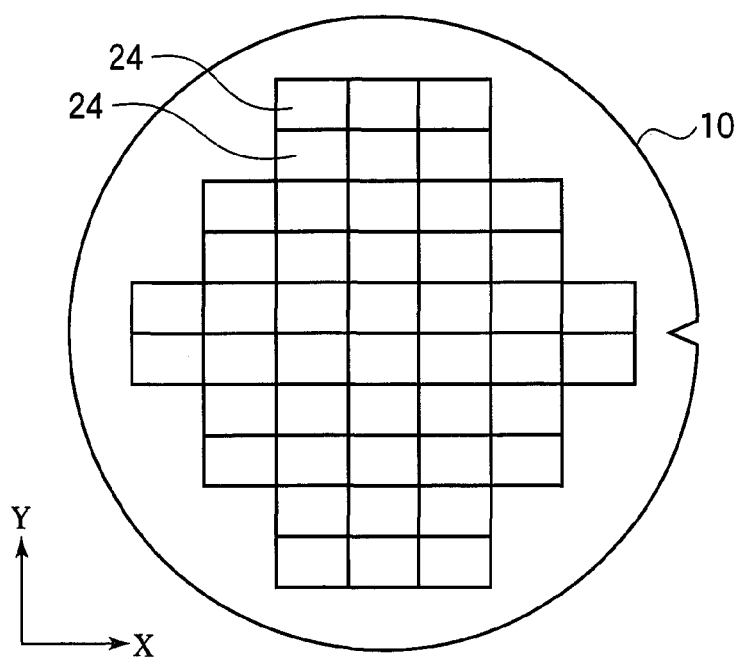

In the experiment, overlay errors taking place when two shots 24 each having a 24 mm-width in the X direction and a 16 mm-width in the Y direction illustrated in FIG. 11B over one shot 22 of the SLR exposure having a 24 mm-width in the X direction and a 32 mm-width in the Y direction were measured. In the SLR exposure, a 5 ppm-wafer scaling in the Y direction took place.

In the example, as described above, in a pilot wafer, the respective components of disalignments with respect to the three coordinate systems of the coordinate system with the wafer center as the origin, the coordinate system with the shot center of the SLR exposure as the origin and the coordinate system with the shot center of the MLR exposure as the origin are computed, and based on a result of this computation, disalignment corrections were given. Subsequently, based on the given disalignment corrections, for the proper wafer, the alignment of shots of the MLR exposure with a shot of the SLR exposure, and then the exposure and development were made. Then, with the disalignment inspection system, overlay errors between the shot of the SLR exposure and the shots of the MLR exposure transferred to the wafer were measured. The overlay errors were measured by measuring the four alignment inspection marks in each of all the shot after developed.

In a control, in a pilot wafer, the respective components of disalignments were computed with respect to only two coordinate systems of the coordinate system with the wafer center as the origin and the coordinate system with the shot center of the MLR exposure, and based on a result of the computation, disalignment corrections were given. Subsequently, based on the given disalignment corrections, for the proper wafer, shots of the MLR exposures were aligned with a shot of the SLR exposure, and the exposure and development were made. Then, in the same way as in the example, with the disalignment inspection system, overlay errors between the shot of the SLR exposure and the shots of the MLR exposure transferred to the proper wafer were measured.

Figure 12A:
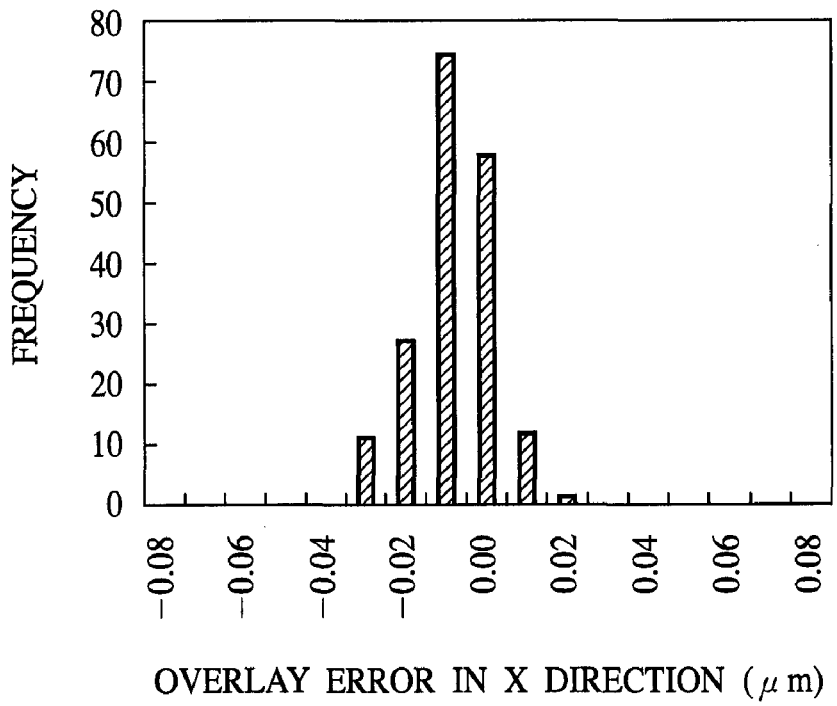
FIG. 12 is graphs of the result of the evaluation of the aligning method according to the second embodiment.
Figure 12B:
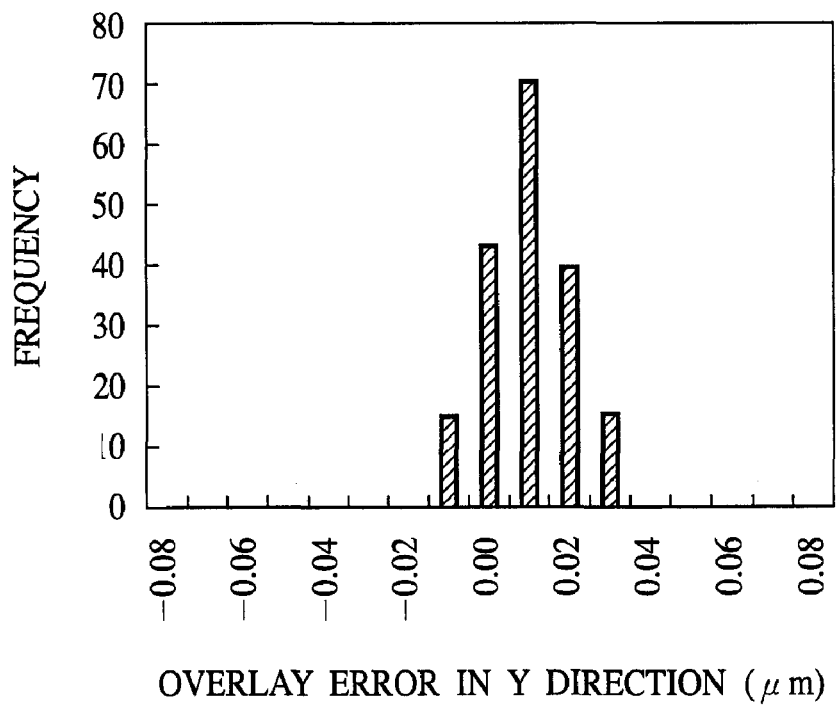

FIG. 12 is histograms of overlay errors measured in the example. FIG. 12A is the histogram of the overlay errors in the X direction, and FIG. 12B is the histogram of the overlay errors in the Y direction. In the example, the scatter of the overlay errors in the X direction was 30.9 nm in $3\sigma$. The scatter of the overlay errors in the Y direction was 27.5 nm in $3\sigma$.

Figure 13A:
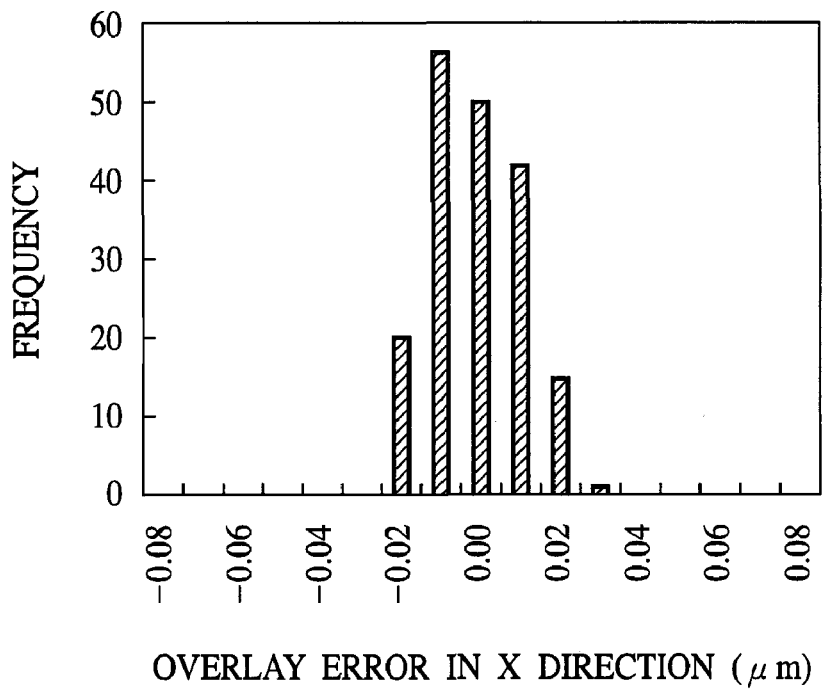
FIG. 13 is graphs of the result of evaluating the aligning method according to a control.
Figure 13B:
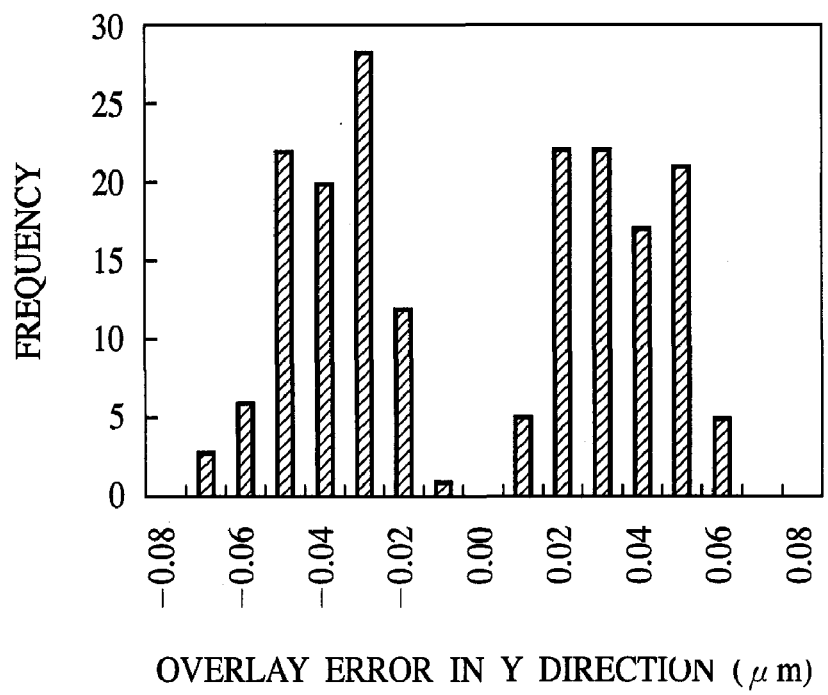

FIG. 13 is histograms of the overlay errors measured in the control. FIG. 13A is the histogram of the overlay errors in the X direction, and FIG. 13B is the histogram of the overlay errors in the Y direction. In the control, the scatter of the alignment errors in the X direction was 32 nm in $3\sigma$. The scatter of the alignment errors in the Y direction was 117 nm in $3\sigma$.

As evident in the histograms of FIGS. 12 and 13, in comparison with the control, the example has smaller overlay errors and smaller scatters of the overlay errors both in the X direction and the Y direction.

Resultantly, it was confirmed that the present embodiment can overlay plural shots of the MLR exposure over one shot of the SLR exposure with high accuracy.

A THIRD EMBODIMENT

Figure 14:
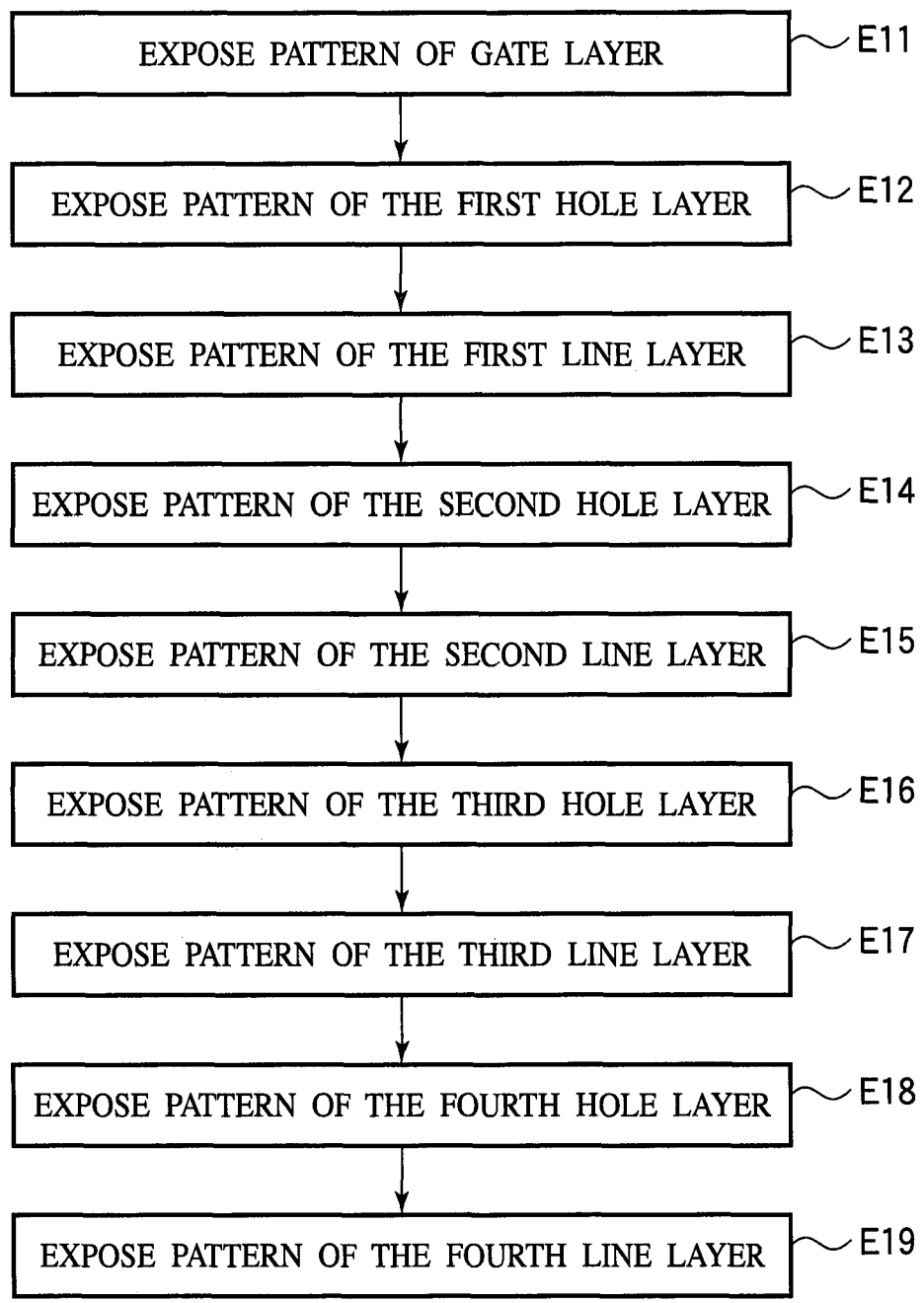
FIG. 14 is a view explaining the exposure steps in the method of manufacturing a semiconductor device according to a third embodiment of the present invention.

The method of manufacturing a semiconductor device according to a third embodiment of the present invention will be explained with reference to FIGS. 14 and 15. FIG. 14 is a view explaining the exposure steps in the method of manufacturing a semiconductor device according to the present embodiment. FIG. 15 is plan views illustrating reticles used in the method of manufacturing a semiconductor device.

In the method of manufacturing a semiconductor device according to the present embodiment, the aligning method according to the present invention is applied to the case in which a plurality of the exposure steps, namely the exposure step of exposing a pattern of a gate layer forming the gate electrodes by the SLR exposure, a plurality of the exposure steps of exposing patterns of contact layers forming the contact holes by the MLR exposure, and a plurality of the exposure steps of exposing patterns of line layers forming interconnection layers are performed.

The method of manufacturing a semiconductor device according to the present embodiment comprises, as shown in FIG. 14, the exposure step E11 of exposing a pattern of a gate layer, the exposure step E12 of exposing a pattern of the first hole layer, the exposure step E13 of exposing a pattern of the first line layer, the exposure step E14 of exposing a pattern of the second hole layer, the exposure step E15 of exposing a pattern of the second line layer, the exposure step E16 of exposing a pattern of the third hole layer, the exposure step E17 of exposing a pattern of the third line layer, the exposure step E18 of exposing a pattern of the fourth hole layer, and the exposure step E19 of exposing a pattern of the fourth line layer.

In the method of manufacturing a semiconductor device according to the present embodiment, which includes the above-described exposure steps, the SLR exposure and the MLR exposure are used properly corresponding to the mask processes of the exposure steps.

Figure 15A:
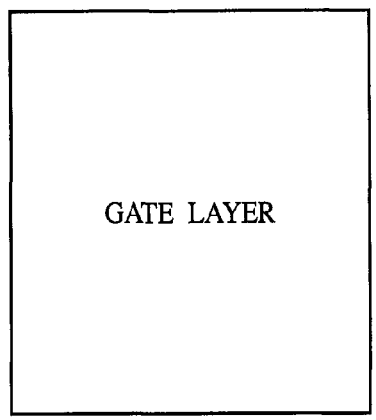
FIG. 15 is plan views illustrating reticles used in the method of manufacturing a semiconductor device according to the third embodiment of the present invention.

Specifically, in the exposure step E11 of exposing the pattern of the gate layer, a negative resist is used. In the exposure step E11, the exposure is made by the SLR exposure. FIG. 15A illustrates the SLR used in the exposure step E11.

Figure 15B:
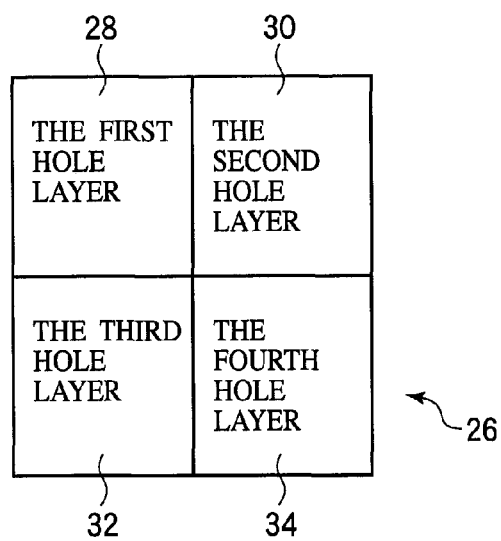

On the other hand, in the exposure steps E12, E14, E16 and E18, respectively for exposing the patterns of the first to the fourth hole layers, a positive resist is used. In these exposure steps E12, E14, E16 and E18, the exposure is made by the MLR exposure using one sheet of reticle. FIG. 15B illustrates the MLR used in the exposure steps E12, E14, E16 and E18. As illustrated, shot regions 28, 30, 32, 34 having the patterns of the first to the fourth hole layers are arranged in one sheet of reticle 26.

Figure 15C:
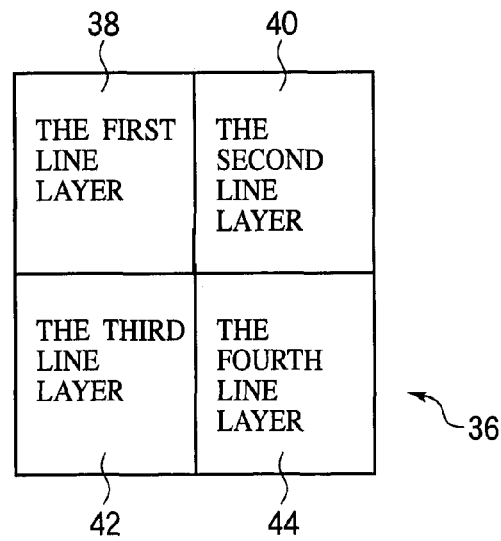

In the exposure steps E13, E15, E17 and E19, respectively for exposing the patterns of the first to the fourth line layers, a positive resist is used. In these exposure steps E13, E15, E17 and E19, the exposure is made by the MLR using one sheet of reticle. FIG. 15C illustrates the MLR used in the exposure steps E13, E15, E17 and E19. As illustrated, shot regions 38, 40, 42, 44 having the patterns of the first to the fourth line layers are arranged in one sheet of reticle 36.

In such method of manufacturing a semiconductor device, over the shot of the SLR exposure for exposing the pattern of the gate layer, the shots of the MLR exposure for exposing the patterns of the first to the fourth hole layers are respectively overlaid by using the aligning method according to the first embodiment.

Over the shot of the SLR exposure for exposing the pattern of the gate layer, the shots of the MLR exposure for exposing the patterns of the first to the fourth line layers are respectively overlaid by using the aligning method according to the first embodiment.

Thus, over the shot of the SLR exposure for exposing the pattern of the gate layer, the shots of the MLR exposure for exposing the patterns of the first to the fourth hole layers can be overlaid with high accuracy. Over the shot of the SLR exposure for exposing the pattern of the gate layer, the shots of the MLR exposure for exposing the patterns of the first to the fourth line layers can be overlaid with high accuracy.

In the present embodiment, the aligning method according to the first embodiment is applied to the method of manufacturing a semiconductor device including the exposure steps shown in FIG. 14, but the aligning method according to the second embodiment may be applied to the method of manufacturing a semiconductor device including the exposure steps shown in FIG. 14.

A FOURTH EMBODIMENT

Figure 16:
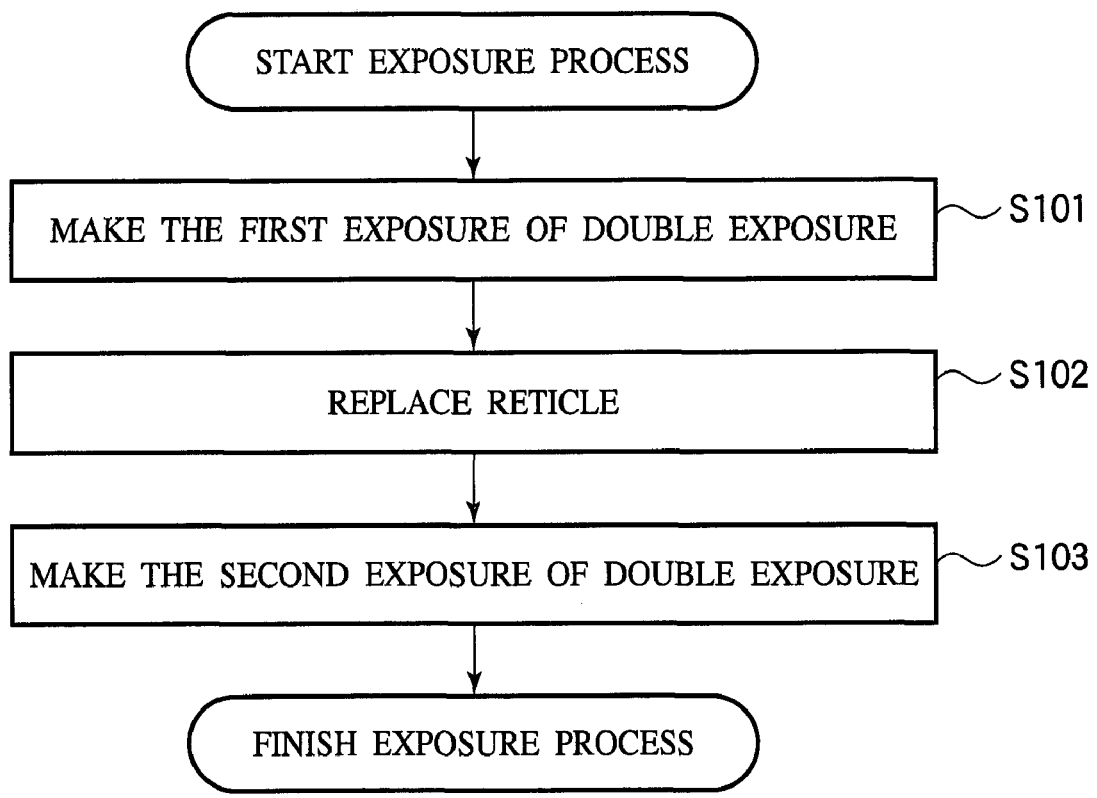
FIG. 16 is a view explaining the general double exposure (Part 1).
Figure 17A:
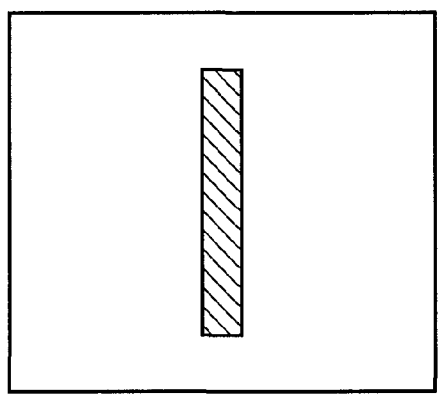
FIG. 17 is a view explaining the general double exposure (Part 2).
Figure 17B:
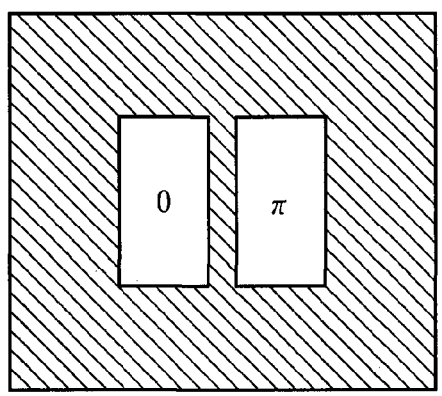
Figure 17C:
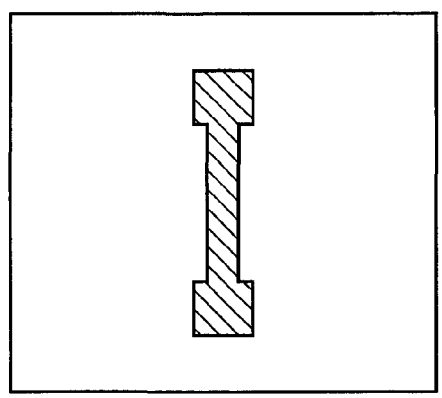
Figure 18:
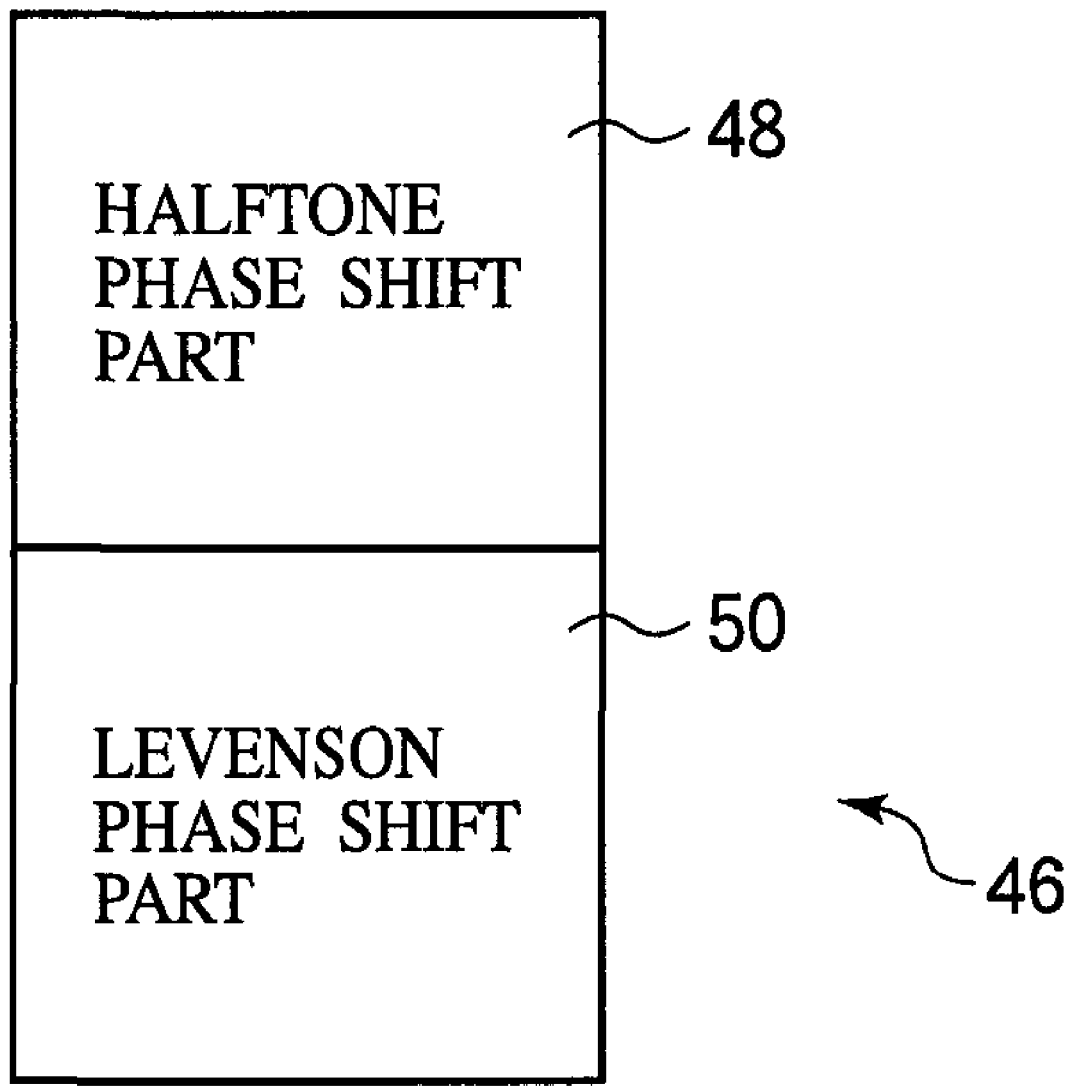
FIG. 18 is a plan view of a reticle used in the method of manufacturing a semiconductor device according to a fourth embodiment of the present invention.
Figure 19:
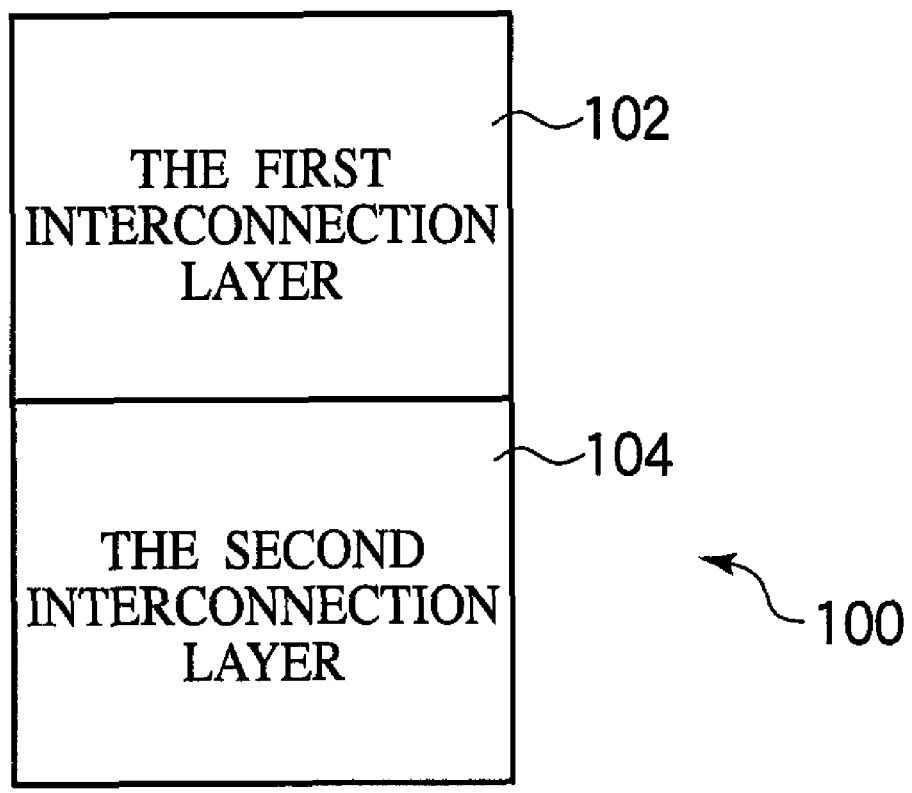
FIG. 19 is a plan view of the MLR having two layers of patterns arranged in one sheet of reticle.
Figure 20A:
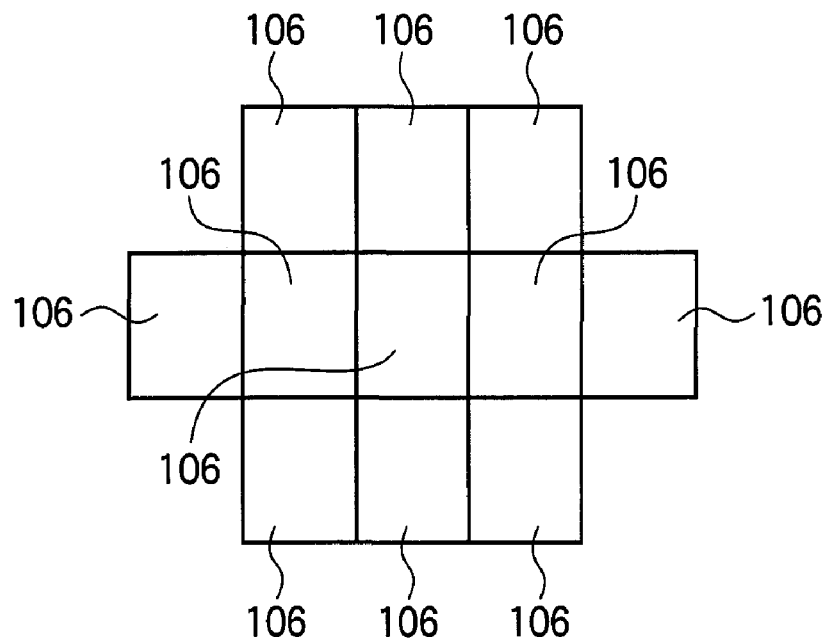
FIG. 20 is a plan views illustrating a shot layout of the SLR exposure and a shot layout of the MLR exposure.
Figure 20B:
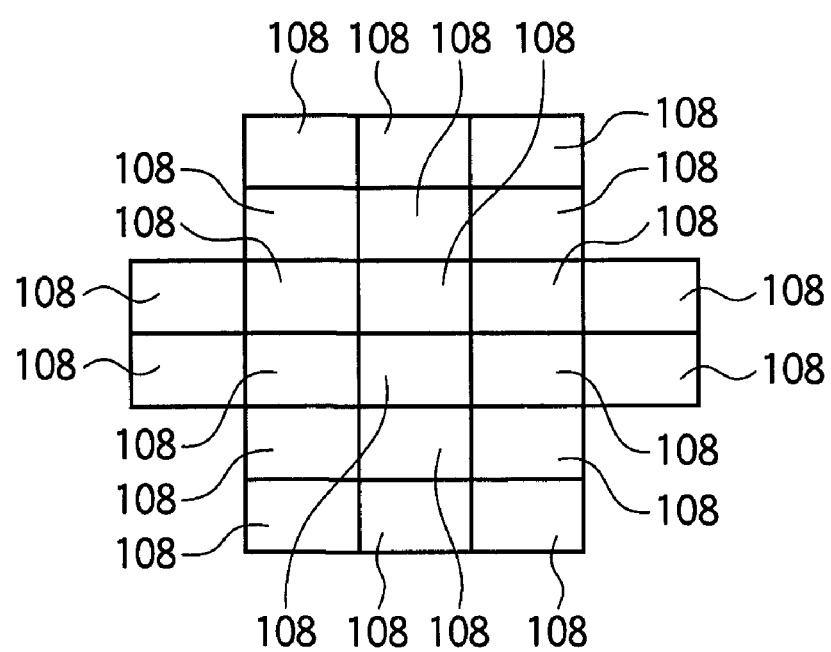

The method of manufacturing a semiconductor device according to a fourth embodiment of the present invention will be explained with reference to FIGS. 16 to 18. FIGS. 16 and 17 are views explaining the general double exposure. FIG. 18 is plan views illustrating a reticle used in the method of manufacturing a semiconductor device according to the present embodiment.

As a method for downsizing patterns to be transferred to a wafer, double exposure for forming fine patterns by making the second exposure following the first exposure, with a mask having finer patterns than the mask used in the first exposure is known.

Here, the general double exposure will be explained with reference to FIGS. 16 and 17. FIG. 16 is a flow chart of the general double exposure. FIG. 17A is a plan view of the mask used in the first exposure of the double exposure, FIG. 17B is a plan view of the mask used in the second exposure of the double exposure, and FIG. 17C is a plan view of patterns formed by the double exposure using the two masks illustrated in FIGS. 17A and 17B.

First, the first exposure of the double exposure is made (Step S101). In the first exposure, the exposure is made with a halftone phase shift mask illustrated in FIG. 17A.

Next, the mask (reticle) in the exposure tool is replaced with the mask to be used in the second exposure (Step S102).

Next, with the replaced mask, the second exposure of the double exposure is made (Step S103). In the second exposure, a Levenson phase shift mask illustrated in FIG. 17B is used.

Thus, the double exposure is completed.

FIG. 17C illustrates the patterns formed by the double exposure using the two masks illustrated in FIGS. 17A and 17B. As illustrated, the pattern is formed, finer than the pattern formed by only the exposure using the mask illustrated in FIG. 17A.

In the double exposure, the mask must be replaced to make exposure twice. It takes time to replace the mask, which lowers the throughput of the exposure tool.

Then, as the mask used in the double exposure, mask patterns formed separately in two masks are arranged in one reticle as the MLR, which makes it unnecessary to replace the mask. Thus, the double exposure is made by the MLR, whereby the throughput of the exposure tool can be improved.

In the method of manufacturing a semiconductor device according to the present embodiment, the aligning method according to the present invention is applied to the double exposure by the MLR.

In the method of manufacturing a semiconductor device according to the present embodiment, as the mask for the double exposure, as illustrated in FIG. 18, the MLR having in one sheet of reticle 46, a halftone phase shift part 48 where a mask pattern to be used in the first exposure of the double exposure is arranged, and a Levenson phase shift part 50 where a mask pattern to be used in the second exposure of the double exposure is used.

In this case, by the aligning method according to the first embodiment, disalignments are corrected, and a shot of the first exposure of the double exposure and a shot of the second exposure of the double exposure are respectively overlaid over a shot of the SLR exposure transferred to a wafer in a previous step, and the exposure is made. Thus, with the shot of the SLR exposure transferred to the wafer in the previous step, the shots of the MLR exposure for the double exposure can be overlaid with high accuracy.

In the present embodiment, the aligning method according to the first embodiment is applied to the double exposure using the MLR, but the aligning method according to the second embodiment may be applied to the double exposure using the MLR.

MODIFIED EMBODIMENTS

The present invention is not limited to the above-described embodiments and can cover other various modifications.

For example, in the above-described embodiments, patterns are exposed on a wafer by the mix-and-match exposure of the SLR exposure and the MLR exposure. However, the present invention is applicable to forming patterns by the mix-and-match exposure of the SLR exposure and the MLR exposure on not only wafers but also various substrates.

In the above-described embodiments, over one shot of the SLR exposure, two or four shots of the MLR exposure are overlaid. However, the number of shots of the MLR exposure to be overlaid over one shot of the SLR is not limited to two or four, and more shots of the MLR exposure may be overlaid over one shot of the SLR exposure.

In the above-described embodiments, the disalignments are computed by using the XY orthogonal coordinate system. However, the computation of the disalignments can be made by using various coordinate systems.

The invention claimed is:

1. An aligning method for forming, over a substrate over which a plurality of first patterns each having plural basic regions formed in an exposure region of one shot, second patterns by plural shots of exposure corresponding to the respective basic regions, comprising:
    measuring, for said plurality of first patterns formed over the substrate, positions of alignment marks to thereby give first positional information;
    giving relative positions of said plurality of first patterns with respect to a first coordinate system with the center of the substrate as the origin, based on the first positional information measured, to thereby compute first disalignments of said plurality of first patterns with respect to the first coordinate system;
    computing second positional information given by subtracting the first disalignments from the first positional information;
    giving relative positions of said plural basic regions with respect to a second coordinate system with the shot center of the first pattern as the origin, based on the second positional information, to thereby compute second disalignments of the first pattern with respect to the second coordinate system;
    computing third positional information given by subtracting the first disalignments and the second disalignments from the first positional information;
    computing third disalignments of the first pattern with respect to a third coordinate system with the shot center of the second pattern as the origin, based on the third positional information; and
    making positioning with respect to the first pattern when the second pattern is exposed, based on the first to the third disalignments.

2. An aligning method according to claim 1, wherein the alignment marks are arranged at least two or more in one shot of the second pattern.

3. An aligning method comprising:
    measuring disalignment inspection marks for one substrate with a plurality of first patterns each having a plurality of basic regions formed in an exposure region of one shot formed on and second patterns formed on by plural shots of exposure corresponding to said respective basic region, to thereby measure disalignments of the second pattern with respect to the first pattern as first disalignment information;
    giving relative positions of said plural second patterns with respect to a first coordinate system with the center of the substrate as the origin to thereby compute first disalignments of said plurality of second patterns with respect to the first coordinate system;
    computing second disalignment information given by subtracting the first disalignments from the first disalignment information;
    giving, based on the second disalignment information, relative positions of said plurality of second patterns with respect to a second coordinate system with the shot center of the first pattern as the origin to thereby compute second disalignments of the second pattern with respect to the second coordinate system;
    computing third disalignment information given by subtracting the first disalignments and the second disalignments from the first disalignment information;
    computing, based on the third disalignment information, third disalignments of the second pattern with respect to a third coordinate system with the shot center of the second pattern as the origin; and
    making positioning with respect to the first pattern when the second pattern is exposed with respect to the first pattern formed on another substrate, based on the first to the third disalignments.

4. An aligning method according to claim 3, wherein the disalignment inspection marks are arranged at least two or more in one shot of the second pattern.

5. An aligning method according to claim 1, wherein respectively in the computation of the first to the third disalignments, a shift, a magnification and a rotation are computed.

6. An aligning method according to claim 3, wherein respectively in the computation of the first to the third disalignments, a shift, a magnification and a rotation are computed.

7. An aligning method according to claim 1, wherein the first pattern is a pattern of a gate layer where a gate electrode is to be formed, and
the second pattern is a pattern of a hole layer where a contact hole is to be formed or a pattern of a line layer where an interconnection is to be formed.

8. An aligning method according to claim 3, wherein the first pattern is a pattern of a gate layer where a gate electrode is to be formed, and
the second pattern is a pattern of a hole layer where a contact hole is to be formed or a pattern of a line layer where an interconnection is to be formed.

9. An aligning method according to claim 1, wherein the second pattern is a pattern to be formed by a double exposure which forms a fine pattern by twice exposures, and the second pattern is positioned with respect to the first pattern, based on the first to the third disalignments when the first exposure and the second exposure of the double exposure are made.

10. An aligning method according to claim 3, wherein the second pattern is a pattern to be formed by a double exposure which forms a fine pattern by twice exposures, and the second pattern is positioned with respect to the first pattern, based on the first to the third disalignments when the first exposure and the second exposure of the double exposure are made.

* * * * *